US012581838B2

(12) United States Patent
Aoyama et al.

(10) Patent No.: US 12,581,838 B2
(45) Date of Patent: Mar. 17, 2026

(54) DISPLAY DEVICE, DISPLAY MODULE, AND FABRICATION METHOD OF DISPLAY DEVICE

(71) Applicant: SEMICONDUCTOR ENERGY LABORATORY CO., LTD., Atsugi (JP)

(72) Inventors: Tomoya Aoyama, Atsugi (JP); Daiki Nakamura, Atsugi (JP); Yutaka Okazaki, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 374 days.

(21) Appl. No.: 18/253,797

(22) PCT Filed: Nov. 24, 2021

(86) PCT No.: PCT/IB2021/060901
    § 371 (c)(1),
    (2) Date: May 22, 2023

(87) PCT Pub. No.: WO2022/118140
    PCT Pub. Date: Jun. 9, 2022

(65) Prior Publication Data
    US 2024/0008342 A1     Jan. 4, 2024

(30) Foreign Application Priority Data
    Dec. 4, 2020     (JP) ................................. 2020-201865

(51) Int. Cl.
    *H10K 59/80*      (2023.01)
    *H10K 59/12*      (2023.01)
    *H10K 59/131*     (2023.01)

(52) U.S. Cl.
    CPC ....... *H10K 59/876* (2023.02); *H10K 59/1201* (2023.02); *H10K 59/80518* (2023.02); *H10K 59/8052* (2023.02); *H10K 59/131* (2023.02)

(58) Field of Classification Search
    CPC ............. H10K 59/876; H10K 59/1201; H10K 59/8052; H10K 59/80518; H10K 59/131
    (Continued)

(56) References Cited

U.S. PATENT DOCUMENTS

| | | | |
|---|---|---|---|
| 5,953,985 A | 9/1999 | Kobayashi | |
| 6,120,338 A | 9/2000 | Hirano et al. | |

(Continued)

FOREIGN PATENT DOCUMENTS

| | | |
|---|---|---|
| CN | 101040397 A | 9/2007 |
| CN | 101874317 A | 10/2010 |

(Continued)

OTHER PUBLICATIONS

International Search Report (Application No. PCT/IB2021/060901), dated Mar. 15, 2022.

(Continued)

*Primary Examiner* — Dzung Tran
(74) *Attorney, Agent, or Firm* — Fish & Richardson P.C.

(57) ABSTRACT

A display device with high resolution is provided. The display device includes a plurality of light-emitting elements that emit light of different colors. The light-emitting element has a microcavity structure and intensifies light with a specific wavelength. The light-emitting elements that emit light of different colors each include a reflective layer and a conductive layer with a varied thickness over a lower electrode, and the lower electrode and the conductive layer are electrically connected to each other in the light-emitting
(Continued)

element. The light-emitting elements with different colors being intensified by different optical path lengths are formed.

17 Claims, 17 Drawing Sheets

(58) Field of Classification Search
USPC .......................................................... 257/72
See application file for complete search history.

(56) References Cited

U.S. PATENT DOCUMENTS

| | | | |
|---|---|---|---|
| 7,399,991 B2 | 7/2008 | Seo et al. |
| 7,663,149 B2 | 2/2010 | Seo et al. |
| 7,741,770 B2 | 6/2010 | Cok et al. |
| 8,471,456 B2 | 6/2013 | Bechtel et al. |
| 2002/0072139 A1 | 6/2002 | Kashiwabara |
| 2008/0093977 A1 | 4/2008 | Bechtel et al. |
| 2009/0051284 A1 | 2/2009 | Cok et al. |
| 2009/0091238 A1 | 4/2009 | Cok et al. |
| 2010/0231484 A1 | 9/2010 | Cok et al. |
| 2011/0148290 A1 | 6/2011 | Oota |
| 2012/0256204 A1 | 10/2012 | Yoshizumi et al. |
| 2012/0273804 A1 | 11/2012 | Hatano |
| 2012/0276484 A1 | 11/2012 | Izumi et al. |
| 2013/0084531 A1 | 4/2013 | Hamaguchi et al. |
| 2013/0084664 A1 | 4/2013 | Yoshitoku et al. |
| 2013/0084666 A1 | 4/2013 | Oshige |
| 2013/0280839 A1 | 10/2013 | Sonoda et al. |
| 2013/0295705 A1 | 11/2013 | Sonoda et al. |
| 2014/0004640 A1 | 1/2014 | Hamaguchi et al. |
| 2014/0004642 A1 | 1/2014 | Otsuka et al. |
| 2015/0060826 A1 | 3/2015 | Matsumoto et al. |
| 2015/0069360 A1 | 3/2015 | Sato |
| 2015/0076476 A1 | 3/2015 | Odaka et al. |
| 2016/0172595 A1 | 6/2016 | Malinowski et al. |
| 2016/0315133 A1 | 10/2016 | Sato |
| 2017/0141167 A1 | 5/2017 | Naganuma |
| 2017/0256754 A1 | 9/2017 | Defranco et al. |
| 2018/0190908 A1 | 7/2018 | Ke et al. |
| 2020/0203662 A1 | 6/2020 | Mollard et al. |
| 2021/0020868 A1 | 1/2021 | Ikeda et al. |

FOREIGN PATENT DOCUMENTS

| | | | |
|---|---|---|---|
| CN | 103000638 A | 3/2013 |
| CN | 112106446 A | 12/2020 |
| EP | 2208245 A | 7/2010 |
| JP | 2000-036385 A | 2/2000 |
| JP | 2002-324673 A | 11/2002 |
| JP | 2003-059663 A | 2/2003 |
| JP | 2006-278257 A | 10/2006 |
| JP | 2008-098106 A | 4/2008 |
| JP | 2008-516405 | 5/2008 |
| JP | 2008-147072 A | 6/2008 |
| JP | 2008-251270 A | 10/2008 |
| JP | 2010-541180 | 12/2010 |
| JP | 2013-012493 A | 1/2013 |
| JP | 2014-120218 A | 6/2014 |
| JP | 2014-135251 A | 7/2014 |
| JP | 2014-232568 A | 12/2014 |
| JP | 2015-115178 A | 6/2015 |
| JP | 2015-201256 A | 11/2015 |
| JP | 2016-197494 A | 11/2016 |
| JP | 2019-179696 A | 10/2019 |
| JP | 2020-160305 A | 10/2020 |
| KR | 2007-0085321 A | 8/2007 |
| KR | 2010-0087707 A | 8/2010 |
| KR | 2021-0007988 A | 1/2021 |
| TW | 200633588 | 9/2006 |
| WO | WO-2006/040704 | 4/2006 |
| WO | WO-2009/025745 | 2/2009 |
| WO | WO-2009/048520 | 4/2009 |
| WO | WO-2019/215530 | 11/2019 |

OTHER PUBLICATIONS

Written Opinion (Application No. PCT/IB2021/060901), dated Mar. 15, 2022.

Zakhidov.A et al., "Orthogonal processing: A new strategy for organic electronics", Chem. Sci. (Chemical Science), Apr. 7, 2011, vol. 2, No. 6, pp. 1178-1182.

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos.N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and BEOL IGZO TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27th International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

100C

100D

100E

100E

FIG. 4A
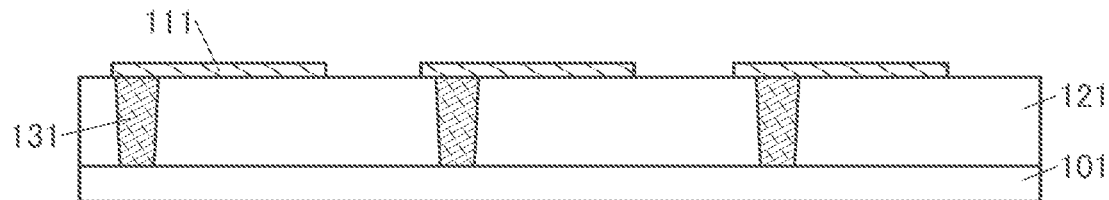
FIG. 4B
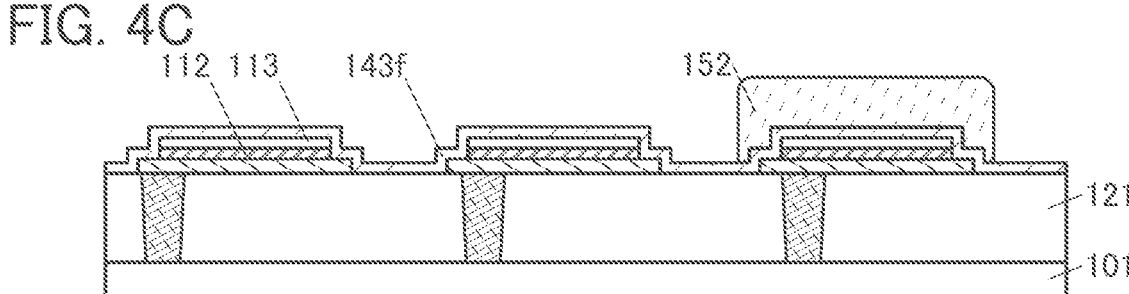
FIG. 4C
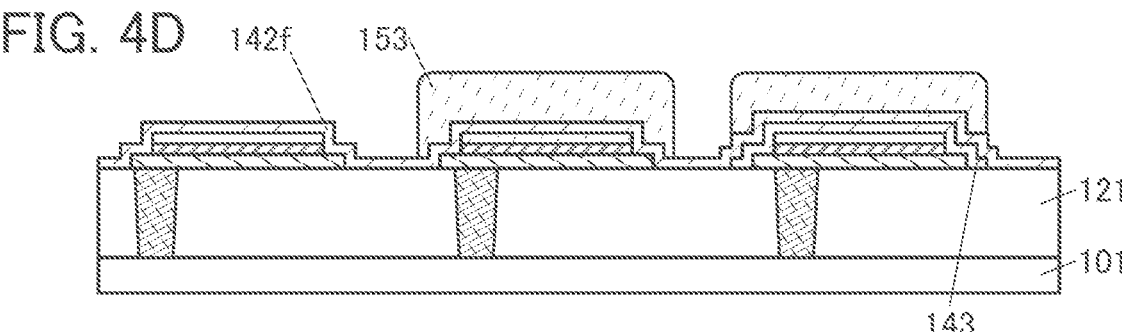
FIG. 4D
FIG. 4E
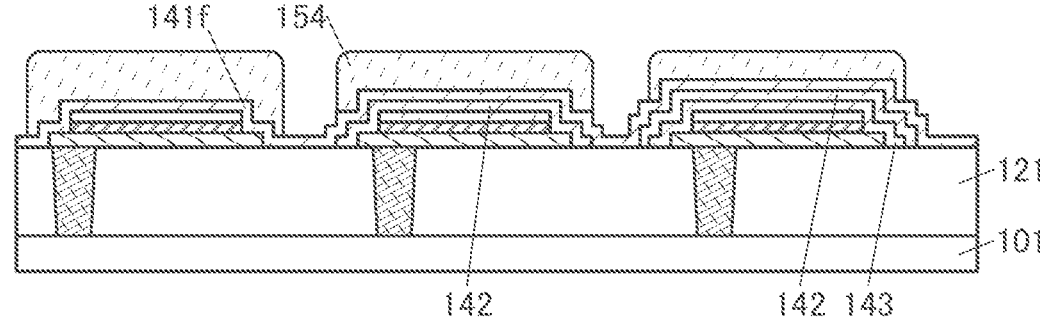

114R        114G        114B

FIG. 7A
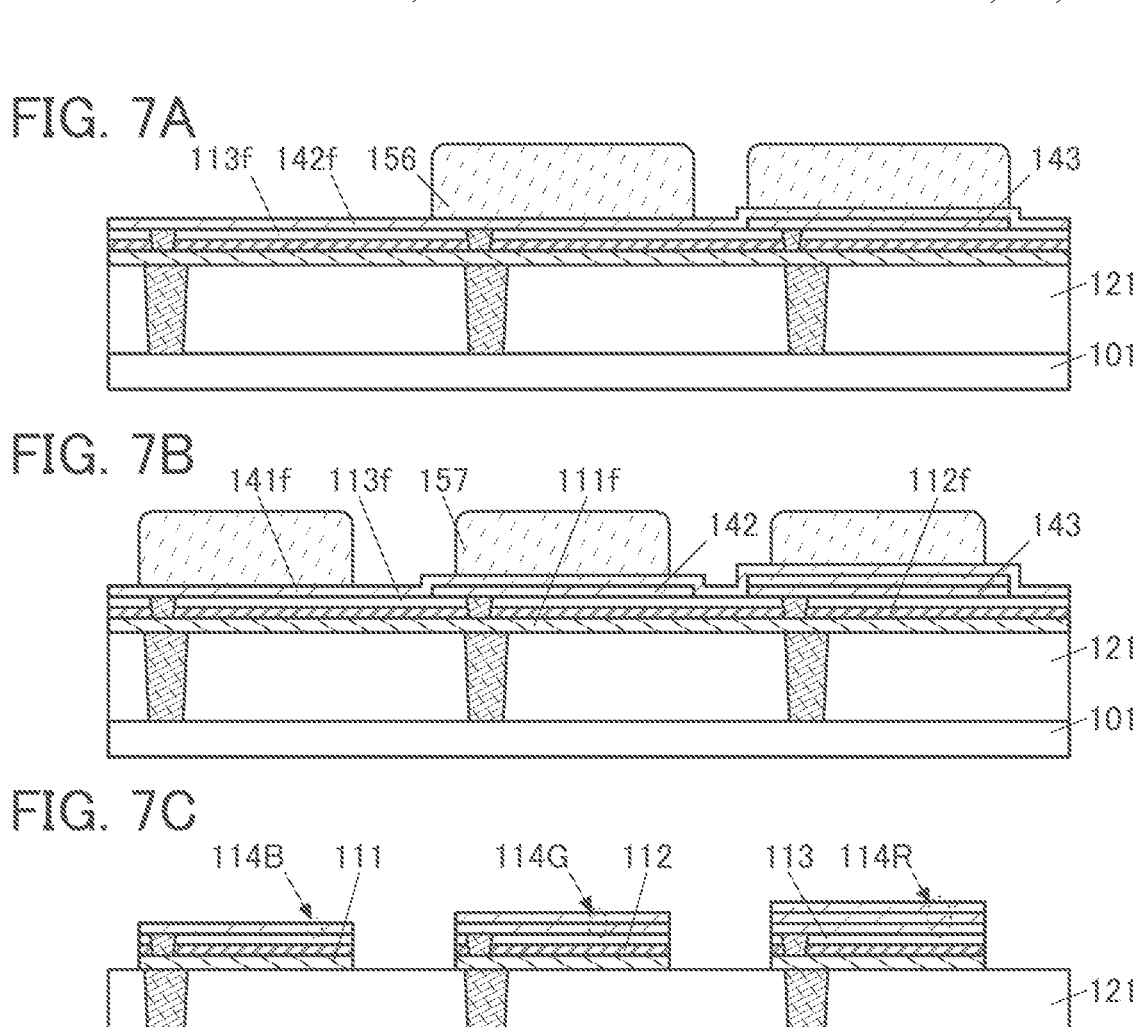
FIG. 7B
FIG. 7C
FIG. 7D
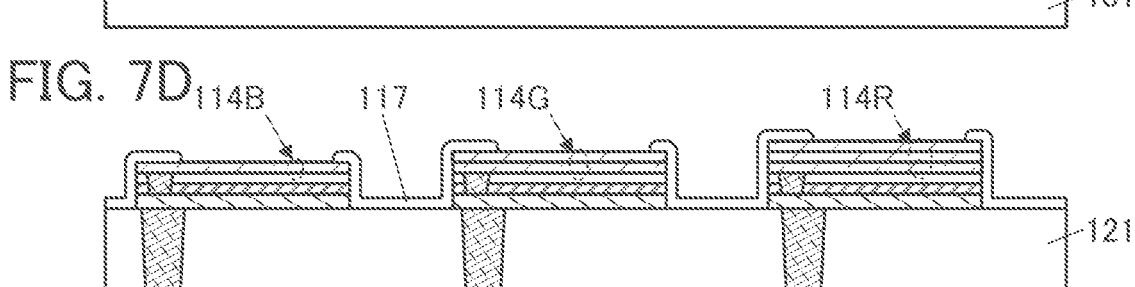
FIG. 7E
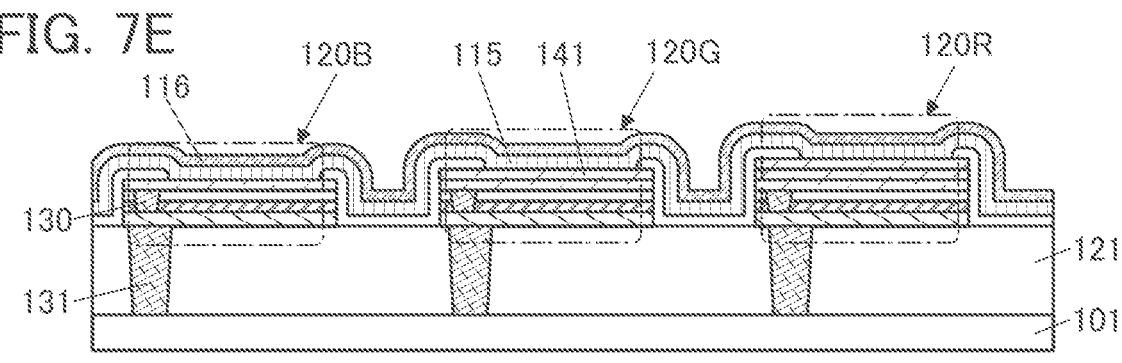

100G

100H

DISPLAY DEVICE, DISPLAY MODULE, AND FABRICATION METHOD OF DISPLAY DEVICE

CROSS REFERENCE TO RELATED APPLICATIONS

This application is a U.S. National Phase Application under 35 U.S.C. § 371 of International Application PCT/IB2021/060901, filed on Nov. 24, 2021, which is incorporated by reference and claims the benefit of a foreign priority application filed in Japan on Dec. 4, 2020, as Application No. 2020-201865.

TECHNICAL FIELD

One embodiment of the present invention relates to a display device, and a display module. One embodiment of the present invention relates to a method for manufacturing a display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. In this specification and the like, a semiconductor device generally refers to a device that can function by utilizing semiconductor characteristics.

BACKGROUND ART

In recent years, higher-resolution display panels have been required. For example, devices for virtual reality (VR), augmented reality (AR), substitutional reality (SR), or mixed reality (MR) are given as devices requiring high-resolution display panels and have been actively developed in recent years.

Examples of a display device that can be used for a display panel include, typically, a liquid crystal display device, a light-emitting device including a light-emitting element such as an organic EL (Electro Luminescence) element or a light-emitting diode (LED), and electronic paper performing display by an electrophoretic method or the like.

The basic structure of an organic EL element is, for example, a structure in which a layer containing a light-emitting organic compound is provided between a pair of electrodes. By applying a voltage to this element, light emission can be obtained from the light-emitting organic compound. A display device using such an organic EL element does not need a backlight that is necessary for a liquid crystal display device and the like; thus, a thin, lightweight, high-contrast, and low-power display device can be achieved. Patent Document 1, for example, discloses an example of a display device using an organic EL element.

REFERENCE

Patent Document

[Patent Document 1] Japanese Published Patent Application No. 2002-324673

SUMMARY OF THE INVENTION

Problems to be Solved by the Invention

In the above-described device for VR, AR, SR, or MR that is wearable, for example, a lens for focus adjustment needs to be provided between eyes and the display panel. Since part of the screen is enlarged by the lens, low resolution of the display panel might cause a problem of weak sense of reality and immersion.

The display panel is also required to have high color reproducibility. In the above-described device for VR, AR, SR, or MR, in particular, the use of a display panel with high color reproducibility enables display with colors that are close to the real colors of objects, which can increase the sense of reality and immersion.

An object of one embodiment of the present invention is to provide a display device with extremely high resolution. Another object of one embodiment of the present invention is to provide a display device in which high color reproducibility is achieved. Another object of one embodiment of the present invention is to provide a high-luminance display device. Another object of one embodiment of the present invention is to provide a highly reliable display device. Another object of one embodiment of the present invention is to provide a method for manufacturing the above display devices.

Note that the description of these objects does not preclude the existence of other objects. One embodiment of the present invention does not need to achieve all these objects. Objects other than these can be derived from the description of the specification, the drawings, the claims, and the like.

Means for Solving the Problems

One embodiment of the present invention is a display device including a first light-emitting element and a second light-emitting element. The first light-emitting element includes a first lower electrode, a first reflective layer, a first insulating layer, a first conductive layer, a light-emitting layer, and an upper electrode. The first lower electrode, the first reflective layer, the first insulating layer, the first conductive layer, the light-emitting layer, and the upper electrode are stacked in this order. The second light-emitting element includes a second lower electrode, a second reflective layer, a second insulating layer, a second conductive layer, the light-emitting layer, and the upper electrode. The second lower electrode, the second reflective layer, the second insulating layer, the second conductive layer, the light-emitting layer, and the upper electrode are stacked in this order. The first conductive layer, the first insulating layer, the second conductive layer, and the second insulating layer each have a light-transmitting property. The second conductive layer is thicker than the first conductive layer. The upper electrode has a transmitting property and a reflective property with respect to visible light. The first lower electrode is electrically connected to the first conductive layer. The second lower electrode is electrically connected to the second conductive layer.

In the above, the first lower electrode is preferably covered with the first conductive layer, and the second lower electrode is preferably covered with the second conductive layer.

One embodiment of the present invention is a display device including a first light-emitting element, a second light-emitting element, a first plug, and a second plug. The first light-emitting element includes a first lower electrode, a first reflective layer, a first insulating layer, a first conductive layer, a light-emitting layer, and an upper electrode. The first lower electrode, the first reflective layer, the first insulating layer, the first conductive layer, the light-emitting layer, and the upper electrode are stacked in this order. The second light-emitting element includes a second lower electrode, a second reflective layer, a second insulating layer, a second conductive layer, the light-emitting layer, and the upper electrode. The second lower electrode, the second reflective layer, the second insulating layer, the second conductive layer, the light-emitting layer, and the upper electrode are stacked in this order. The first conductive layer, the first insulating layer, the second conductive layer, and the second insulating layer each have a light-transmitting property. The second conductive layer is thicker than the first conductive layer. The upper electrode has a transmitting property and a reflective property with respect to visible light. The first lower electrode is electrically connected to the first conductive layer through the first plug. The second lower electrode is electrically connected to the second conductive layer through the second plug. The first plug is embedded in the first insulating layer, and the second plug is embedded in the second insulating layer.

In the above, the first conductive layer preferably includes a first film. The second conductive layer preferably includes a second film and a third film. The second film and the third film are preferably stacked in this order. The first film and the third film preferably have the same composition.

In the above, a circuit layer including a transistor is preferably included. The first light-emitting element is preferably provided over the circuit layer and electrically connected to the transistor. The transistor may include a metal oxide with crystallinity or single crystal silicon in a semiconductor layer where a channel is formed.

In the above, a first circuit layer including a first transistor, a second circuit layer including a second transistor, a third insulating layer positioned over the first circuit layer, and a fourth insulating layer between the first circuit layer and the second circuit layer are preferably included. The first light-emitting element is preferably electrically connected to the first transistor. In the above, the first transistor preferably includes a metal oxide with crystallinity in a first semiconductor layer where a channel is formed, and the second transistor preferably includes a metal oxide with crystallinity or single crystal silicon in a second semiconductor layer where a channel is formed.

In the above, it is preferable that a plurality of the first light-emitting elements are included, and the first light-emitting elements be periodically arranged at a resolution of 2000 ppi or higher. The first light-emitting elements may be placed in delta arrangement.

Another embodiment of the present invention is method for manufacturing a display device, including a step of forming a first lower electrode and a second lower electrode apart from each other over a formation surface, a step of forming a first reflective layer over the first lower electrode and a second reflective layer over the second lower electrode, a step of forming a first insulating layer over the first reflective layer and a second insulating layer over the second reflective layer, a step of forming a first conductive layer covering the first lower electrode and a second conductive layer covering the second lower electrode, and a step of forming a light-emitting layer over the first conductive layer and the second conductive layer, and an upper electrode over the light-emitting layer. The second conductive layer is formed to be thicker than the first conductive layer, the first conductive layer and the second conductive layer are each formed to have a light-transmitting property, the first lower electrode is electrically connected to the first conductive layer, the second lower electrode is electrically connected to the second conductive layer, and the upper electrode is formed to have a light-transmitting property and a reflective property.

Another embodiment of the present invention is a method for manufacturing a display device, including a step of forming a first conductive film to be a first lower electrode and a second lower electrode over a formation surface, a step of forming a second conductive film to be a first reflective layer and a second reflective layer, covering the first conductive film, a step of forming a first insulating film to be a first insulating layer and a second insulating layer over the first conductive film, a step of embedding a first plug and a second plug in the first insulating film and electrically connecting each of the first plug and the second plug to the first conductive film, a step of forming a first conductive layer over the first plug, and a step of forming a second conductive layer over the second plug. In addition, a step of processing the first conductive film, the second conductive film, the first insulating film, the first conductive layer, and the second conductive layer into island shapes, and forming the first lower electrode, the second lower electrode, the first reflective layer, the second reflective layer, the first insulating layer, and the second insulating layer, and a step of forming a light-emitting layer over the first conductive layer and the second conductive layer, and an upper electrode over the light-emitting layer are included.

In the above, the second conductive layer is formed to be thicker than the first conductive layer, the first conductive layer and the second conductive layer are each formed to have a light-transmitting property, the first conductive layer is electrically connected to the first lower electrode through the first plug, the second conductive layer is electrically connected to the second lower electrode via the second plug, and the upper electrode is formed to have a light-transmitting property and a reflective property.

Effect of the Invention

According to one embodiment of the present invention, a display device with extremely high resolution can be provided. A display device in which high color reproducibility is achieved can be provided. A high-luminance display device can be provided. A highly reliable display device can be provided. A method for manufacturing the above display devices can be provided.

Note that the description of these effects does not preclude the existence of other effects. One embodiment of the present invention does not need to have all these effects. Effects other than these can be derived from the description of the specification, the drawings, the claims, and the like.

BRIEF DESCRIPTION OF THE DRAWINGS

FIG. 4A to FIG. 4E are diagrams illustrating an example of a manufacturing method of a display device.

FIG. 7A to FIG. 7E are diagrams illustrating an example of a manufacturing method of a display device.

MODE FOR CARRYING OUT THE INVENTION

Figure 1A:
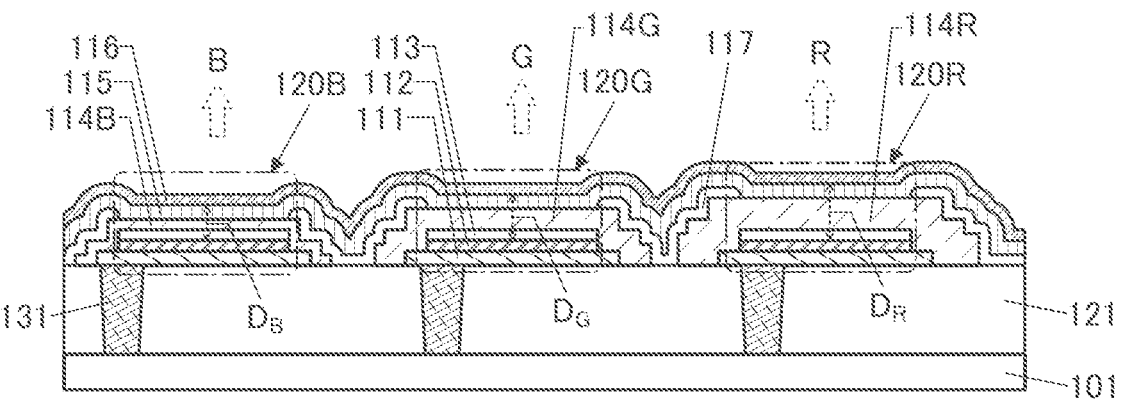
FIG. 1A and FIG. 1B are each a diagram illustrating a structure example of a display device.

Hereinafter, embodiments are described with reference to the drawings. Note that the embodiments can be implemented in many different modes, and it will be readily understood by those skilled in the art that modes and details thereof can be changed in various ways without departing from the spirit and scope thereof. Thus, the present invention should not be construed as being limited to the following description of the embodiments.

Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In each drawing described in this specification, the size, the layer thickness, or the region of each component is exaggerated for clarity in some cases. Thus, they are not limited to the illustrated scale.

In this specification and the like, the ordinal numbers such as "first" and "second" are used in order to avoid confusion among components and do not limit the number.

Embodiment 1

In this embodiment, a display device of one embodiment of the present invention and a manufacturing method of the display device will be described.

The display device of one embodiment of the present invention includes light-emitting elements (also referred to as light-emitting devices) that emit light with different colors. The light-emitting element includes a lower electrode, an upper electrode, and a layer containing a light-emitting compound (also referred to as a light-emitting layer or an EL layer) therebetween. As the light-emitting element, an electroluminescent element such as an organic EL element or an inorganic EL element is preferably used. Alternatively, a light-emitting diode (LED) may be used.

The light-emitting element also includes a conductive layer that has a transmitting property with respect to visible light (a light-transmitting property) (such a layer is also referred to as an optical adjustment layer), a reflective layer that reflects visible light coming through the conductive layer, and an insulating layer that has a light-transmitting property. In addition, a conductive film having a light-transmitting property and a reflective property is preferably used for the upper electrode in the light-emitting element. The light-emitting element has what is called a microcavity structure and intensifies light with a certain wavelength.

The display device of one embodiment of the present invention preferably expresses two or more different colors, with the use of light-emitting elements emitting white light. In this case, a structure can be employed in which the light-emitting layer and the upper electrode are shared by the two light-emitting elements emitting light of different colors, and the lower electrodes of the elements are electrically insulated from each other. In addition, it is preferable that the two light-emitting elements be different in the distance between the light-emitting layer and the reflective layer. With this structure, light where each light with a different wavelength being intensified can be emitted, and two or more different colors can be expressed with the use of light-emitting elements that emit white light.

In the display device of one embodiment of the present invention, the light-transmitting conductive layer is formed by more than one step, over the reflective layer formed over the lower electrode; in that way conductive layers with different thickness can be formed in different light-emitting elements. Moreover, it is preferable that an insulating layer with a light-transmitting property be provided between the reflective layer and the conductive layer in order to prevent electric corrosion of the reflective layer and the conductive layer. After that, the light-emitting layer and the upper electrode are formed over the top surface of the conductive layer, whereby the light-emitting elements with different colors being intensified by different optical distances (optical path lengths) can be formed.

In the display device of one embodiment of the present invention, the lower electrode is electrically connected to the conductive layer formed over the reflective layer. The conductive layer is formed to cover the lower electrode and is electrically connected to the lower electrode. Alternatively, a structure in which a plug is provided between the conductive layer and the lower electrode may be employed.

In other words, the display device of one embodiment of the present invention has a structure in which the reflective layer is provided over the lower electrode provided over a formation surface and the conductive layer is provided over the reflective layer. In addition, the insulating layer can be provided in contact with the reflective layer. The thickness of the conductive layer positioned between the light-emitting layer and the reflective layer can be controlled by forming the conductive layer by more than one step. The conductive layer included in the display device of one embodiment of the present invention has a function of adjusting the optical distance (also referred to as optical path length) by its thickness, and thus can be referred to as the optical adjustment layer.

Two light-emitting elements each include a conductive layer with a different thickness, so that light emitted from each of the light-emitting elements is light where light with a different wavelength is intensified. The difference in optical distance between the light-emitting elements is determined by a difference in thickness of the conductive layer. Thus, the optical distances of the two light-emitting elements can be adjusted accurately, which enables high-yield fabrication of a display device with high display quality, which has not only high color reproducibility but also reduced color unevenness between the light-emitting elements.

In the display device of one embodiment of the present invention, light-emitting elements with different colors can be formed with extremely high accuracy. Since the conductive layer and the lower electrode are electrically connected to each other in the light-emitting element, light-emitting elements can be arranged with an extremely high density. Thus, a display device with higher resolution than a conventional display device can be achieved. For example, the display device preferably has extremely high resolution in which pixels each including one or more light-emitting elements are arranged with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Although description is made here using mainly two light-emitting elements for easy description, light-emitting elements exhibiting three primary colors or four or more colors are preferably provided. Specifically, the light-emitting units emitting light of red (R), green (G), and blue (B) can be included. Alternatively, a light-emitting element emitting light of yellow (Y), cyan (C), magenta (M), white (W), or the like may be provided in addition to or instead of the above.

More specific structure examples and a manufacturing method example will be described below with reference to drawings.

Structure Example 1

Structure Example 1-1

FIG. 1A is a schematic cross-sectional view illustrating a display device 100A of one embodiment of the present invention. The display device 100A includes a light-emitting element 120R, a light-emitting element 120G, and a light-emitting element 120B. The light-emitting element 120R is a light-emitting element that emits red light, the light-emitting element 120G is a light-emitting element that emits green light, and the light-emitting element 120B is a light-emitting element that emits blue light.

In the following description common to the light-emitting element 120R, the light-emitting element 120G, and the light-emitting element 120B, the alphabets are omitted from the reference numerals and the term "light-emitting element 120" is used in some cases. Similarly, a conductive layer 114R, a conductive layer 114G, and a conductive layer 114B which will be described later are denoted by "conductive layer 114" in some cases. The conductive layer 114R is included in the light-emitting element 120R. Similarly, the conductive layer 114G is included in the light-emitting element 120G, and the conductive layer 114B is included in the light-emitting element 120B.

The light-emitting element 120 includes a conductive layer 111 functioning as a lower electrode, the reflective layer 112, an insulating layer 113, a conductive layer 114, an EL layer 115, and a conductive layer 116 functioning as an upper electrode. The insulating layer 113 and the conductive layer 114 each have a function of transmitting visible light, and the conductive layer 116 has a transmissive property and a reflective property with respect to visible light. The EL layer 115 includes a light-emitting compound.

As the light-emitting element 120, it is possible to use an electroluminescent element having a function of emitting light in accordance with current flowing into the EL layer 115 when a potential difference is applied between the conductive layer 111 and the conductive layer 116. In particular, an organic EL element using a light-emitting organic compound is preferably used for the EL layer 115. In addition, the light-emitting element 120 is preferably an element emitting white light, which has two or more peaks in the visible light region of the emission spectrum.

The reflective layer 112 is provided over the conductive layer 111. The reflective layer 112 reflects visible light. The insulating layer 113 is provided over the reflective layer 112. The reflective layer 112 and the insulating layer 113 are provided such that they are smaller than the conductive layer 111 when seen from above. That is, it is acceptable if the edges of the reflective layer 112 and the insulating layer 113 are positioned inside the conductive layer 111 when seen from above (in a plan view). A portion of the conductive layer 111 is preferably in contact with the conductive layer 114 which will be described later. The size of the reflective layer 112 and that of the insulating layer 113 seen from the above are preferably close to the size of the conductive layer 111. The reflective layer 112 and the insulating layer 113 preferably have an island-like shape when seen from above.

Figure 1B:
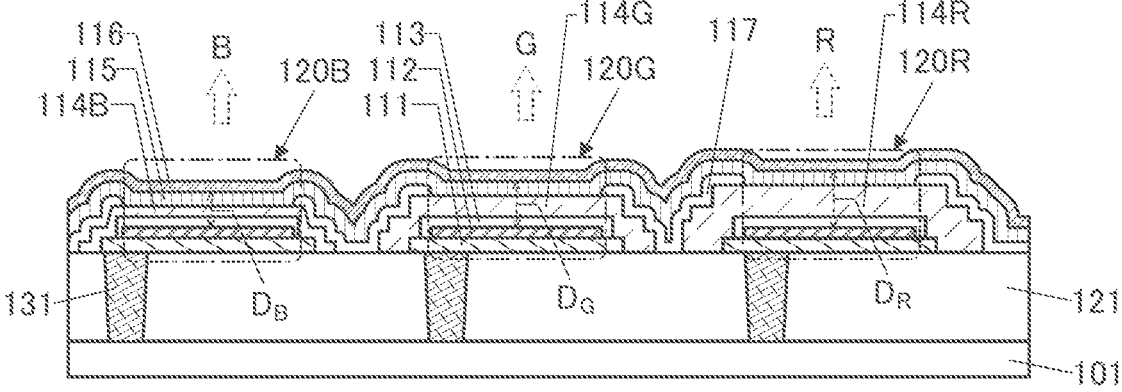

The conductive layer 114 is provided over the insulating layer 113. The insulating layer 113 is positioned between the reflective layer 112 and the conductive layer 114, and has a function of preventing electric corrosion which is caused when the reflective layer 112 and the conductive layer 114 are in contact with each other. As illustrated by a display device 100B in FIG. 1B, the insulating layer 113 may also cover end portions of the reflective layer 112. Such a structure is preferable in that the reflective layer 112 is surrounded by the insulating layer 113 and the lower electrode 111, which makes it possible to securely prevent the electric corrosion of the reflective layer 112 with the conductive layer 114 and to improve the reliability of the display device. The conductive layer 114 covers the conductive layer 111 and is electrically connected to the conductive layer 111 by contacting the conductive layer 111 on its end portions. This is preferable because the provision of a contact for electrical connection of the conductive layer 111 is unnecessary and an opening (light-emitting portion) can be larger.

The EL layer 115 and the conductive layer 116 extend across and are shared by the light-emitting element 120R, the light-emitting element 120G, and the light-emitting element 120B. The conductive layer 116 functions as, for example, the upper electrode to which a common potential is applied. Providing the conductive layer 116 to be shared is preferable because it can reduce the manufacturing steps of the light-emitting element 120. A potential for controlling the amount of light emitted from the light-emitting element 120 is independently applied to the conductive layer 111 provided in each of the light-emitting elements 120. The conductive layers 111 function as pixel electrodes, for example.

In the display device 100A, an insulating layer 117 is provided between two light-emitting elements 120. The insulating layer 117 has a function of preventing electrical short circuit between the conductive layer 116 and the pixel electrode because of a decrease in the thickness of the EL layer 115 due to a step in the end portion of the conductive layer 114. As illustrated in FIG. 1A, for higher coverage with the EL layer 115, an end portion of the insulating layer 117 positioned over the conductive layer 114 preferably has a tapered shape. The insulating layer 117 is positioned between adjacent two light-emitting elements 120 and covers the end portion of the conductive layer 114 included in each of the light-emitting elements 120. In FIG. 1A, for example, the insulating layer 117 positioned between the light-emitting element 120R and the light-emitting element 120G covers the end portion of the conductive layer 114R and the end portion of the conductive layer 114G. In FIG. 1A, the insulating layer 117 positioned between the light-emitting element 120G and the light-emitting element 120B covers the end portion of the conductive layer 114G and the end portion of the conductive layer 114B.

Here, the conductive layers 114 included in the light-emitting elements 120 have different thicknesses in different light-emitting elements. Among the three conductive layers 114, the conductive layer 114B has the smallest thickness and the conductive layer 114R has the largest thickness. Here, as illustrated in FIG. 1A, when the distances between top surfaces of the reflective layers 112 and the bottom surface of the conductive layer 116 (i.e., an interface between the conductive layer 116 and the EL layer 115) in the light-emitting elements are referred to as a distance DR, a distance DG, and a distance DB, the distance DR is the largest and the distance DB is the smallest. The difference between the distance DR, the distance DG, and the distance DB corresponds to the difference in optical distance (optical path length) in the light-emitting elements.

The light-emitting element 120R has the longest optical path length among the three light-emitting elements, and thus emits light R where light positioned at the longest wavelength is intensified. In contrast, the light-emitting element 120B has the shortest optical path length, and thus emits light B where light positioned at the shortest wavelength is intensified. The light-emitting element 120G emits light G where light with the intermediate wavelength is intensified. For example, the light R is light where light with red color is intensified, the light G is light where light with green color is intensified, and the light B is light where light with blue color is intensified. With the above structure, there is no need to individually form EL layers, included in the light-emitting elements 120, for different light-emitting elements with different colors; thus, color display with high color reproducibility can be performed using elements with the same structure. In addition, the light-emitting elements 120 can be arranged with an extremely high density. For example, a display device having resolution exceeding 2000 ppi can be achieved.

The display device 100A includes the above-described light-emitting element 120R, light-emitting element 120G, and light-emitting element 120B over a substrate 101 with a semiconductor circuit. The display device 100A also includes an insulating layer 121 and a plug 131.

A circuit substrate including a transistor, a wiring, or the like can be used as the substrate 101. Note that in the case where a passive matrix method or a segment method can be used, an insulating substrate such as a glass substrate can be used as the substrate 101. The substrate 101 is a substrate provided with a circuit for driving the light-emitting elements (also referred to as a pixel circuit) or a semiconductor circuit functioning as a driver circuit for driving the pixel circuit. More specific structure examples of the substrate 101 will be described later.

The substrate 101 is electrically connected to the conductive layer 111 of the light-emitting element 120 through the plug 131. The plug 131 is formed to be embedded in an opening provided in the insulating layer 121. The conductive layer 111 is provided in contact with a top surface of the plug 131.

Structure Example 1-2

Figure 2A:
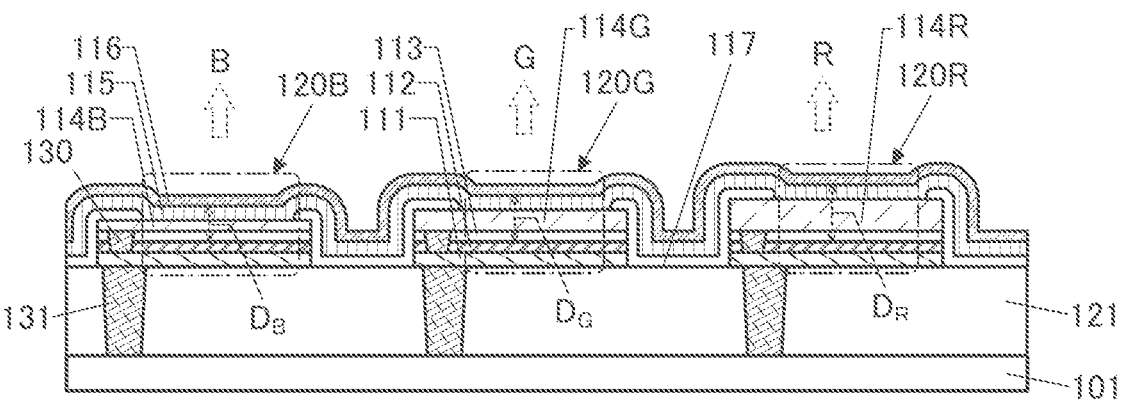
FIG. 2A and FIG. 2B are each a diagram illustrating a structure example of a display device.

FIG. 2A is a schematic cross-sectional view of a display device 100C. The display device 100C is different from the above-described display device 100A mainly in that a plug 130 is included and the structure of the conductive layer 114 is different.

Figure 2B:
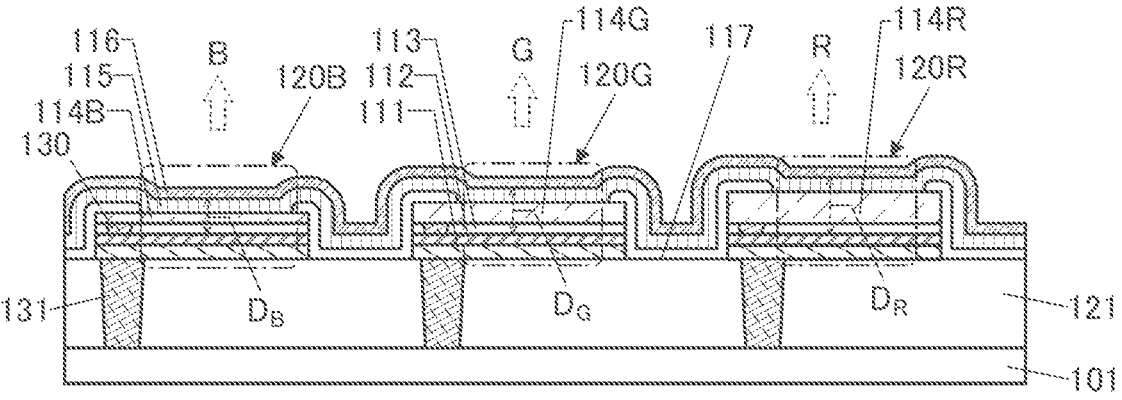

In the display device 100C, the reflective layers 112, the insulating layers 113, and the conductive layers 114 having different thicknesses in different light-emitting elements are stacked in this order over the respective conductive layers 111. The conductive layer 114 is electrically connected to the conductive layer 111 through the plug 130. Because of this structure, it is not necessary to provide the conductive layer 114 to be larger than the conductive layer 111, which is preferable. Such a structure allows the area of the conductive layer 111 functioning as a pixel electrode to increase. Furthermore, the plug 130 can be provided between the conductive layer 114 and the conductive layer 111, which can increase the aperture ratio of the pixel. Although a structure in which the plug 130 is embedded in the insulating layer 113 and the reflective layer 112 is shown in FIG. 2A, a structure in which the plug 130 is embedded in the insulating layer 113 and in contact with the reflective layer 112 can also be employed, as in a display device 100D shown in FIG. 2B. In that case, a structure without the conductive layer 111 being provided, in which the reflective layer 112 and the plug 130 are in contact with each other, may be employed; however, when the reflective layer 112 is thin, for example, an opening for forming the plug 130 might penetrate the reflective layer 112 at the time of the formation of the opening in the insulating layer 113. For this reason, it is preferable to provide the conductive layer 111.

Structure Example 1-3

Figure 3A:
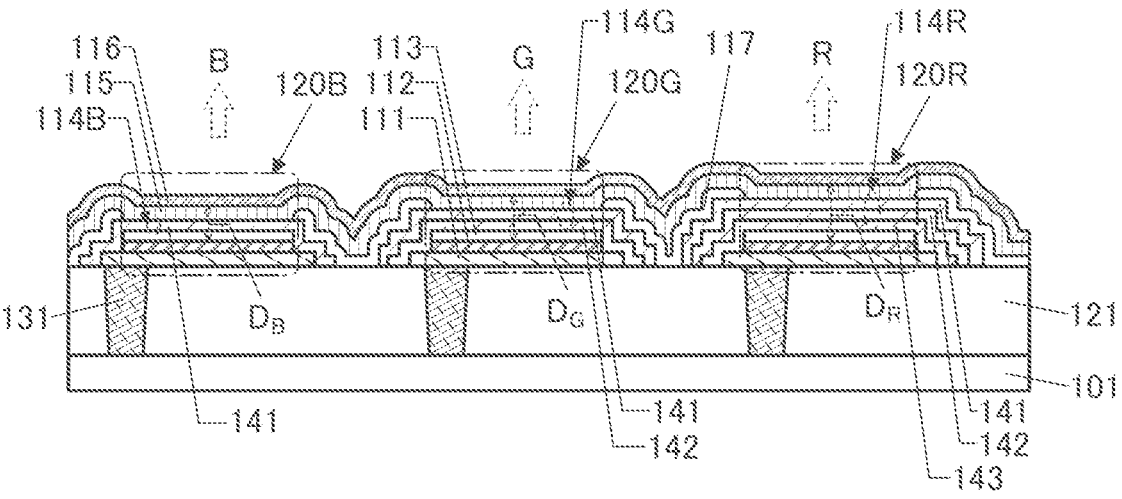
FIG. 3A and FIG. 3B are each a diagram illustrating a structure example of a display device.
Figure 3B:
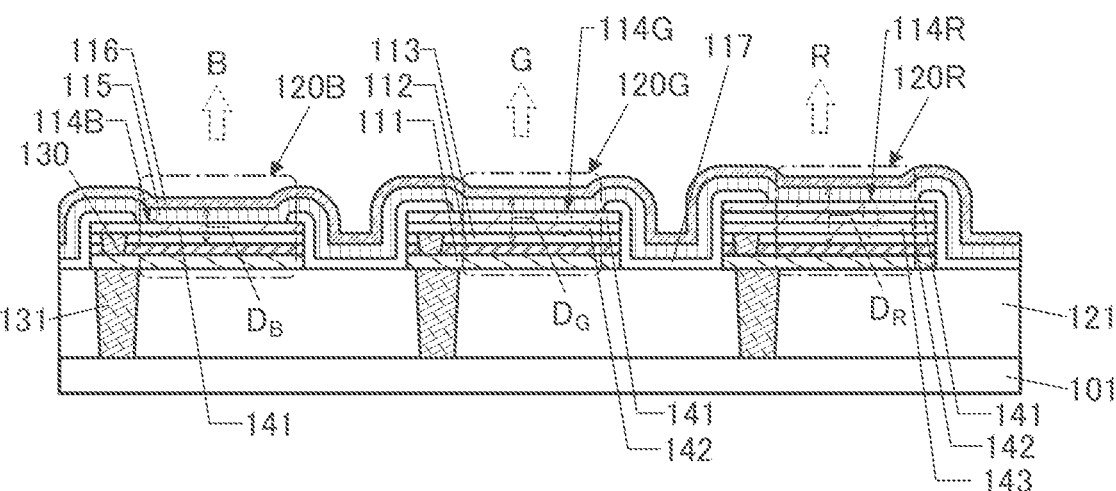

FIG. 3A is a schematic cross-sectional view of a display device 100E, and FIG. 3B is a schematic cross-sectional view of a display device 100F. The display device 100E is different from the display device 100A and the display device 100F is different from the display device 100C, mainly in that the structures of the conductive layer 114R of the light emitting-element 120R and the conductive layer 114G of the light-emitting element 120G are different.

The conductive layer 114R has a stacked-layer structure in which a conductive layer 143, a conductive layer 142, and a conductive layer 141 are stacked in this order from the reflective layer 112 side. The conductive layer 114G has a stacked-layer structure in which the conductive layer 142 and the conductive layer 141 are stacked in this order from the reflective layer 112 side. The conductive layer 114B is formed of the conductive layer 141.

It is preferable that a material transmitting visible light be used for the conductive layer 141, the conductive layer 142, and the conductive layer 143. Using the same material for the conductive layer 141, the conductive layer 142, and the conductive layer 143 is preferable because in that case the same processing tool can be used.

[Components]

[Light-Emitting Element]

As a light-emitting element that can be used as the light-emitting element 120, a self-luminous element can be used, and an element whose luminance is controlled by current or voltage is included in the category. For example, an LED, an organic EL element, an inorganic EL element, or the like can be used. In particular, an organic EL element is preferably used.

The light-emitting element has a top-emission structure, a bottom-emission structure, a dual-emission structure, or the like. A conductive film that transmits visible light is used as the electrode through which light is extracted. A conductive film that reflects visible light is used as the electrode through which light is not extracted.

In one embodiment of the present invention, a top-emission light-emitting element in which light is emitted to the opposite side of the formation surface or a dual-emission light-emitting element can be particularly suitably used.

The EL layer 115 includes at least a light-emitting layer. The EL layer 115 may further include, as a layer other than the light-emitting layer, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

Either a low molecular compound or a high molecular compound can be used for the EL layer 115, and an inorganic compound may also be contained. The layers that constitute the EL layer 115 can each be formed by a method such as an evaporation method (including a vacuum evaporation method), a transfer method, a printing method, an inkjet method, or a coating method.

When a voltage higher than the threshold voltage of the light-emitting element 120 is applied between a cathode and an anode, holes are injected to the EL layer 115 from the anode side and electrons are injected to the EL layer 115 from the cathode side. The injected electrons and holes are recombined in the EL layer 115 and a light-emitting substance contained in the EL layer 115 emits light.

In the case where a light-emitting element emitting white light is used as the light-emitting element 120, the EL layer 115 preferably contains two or more kinds of light-emitting substances. A white emission can be obtained by selecting light-emitting substances so that two or more light-emitting substances emit light of complementary colors, for example. For example, it is preferable to contain two or more out of light-emitting substances emitting light of R (red), G (green), B (blue), Y (yellow), O (orange), and the like or light-emitting substances emitting light containing two or more of spectral components of R, G, and B. A light-emitting element whose emission spectrum has two or more peaks in the wavelength range of a visible light region (e.g., 350 nm to 750 nm) is preferably employed. An emission spectrum of a material emitting light having a peak in a yellow wavelength range preferably includes spectral components also in green and red wavelength ranges.

The EL layer 115 preferably has a structure in which a light-emitting layer containing a light-emitting substance emitting light of one color and a light-emitting layer containing a light-emitting substance emitting light of another color are stacked. For example, the plurality of light-emitting layers in the EL layer 115 may be stacked in contact with each other or may be stacked with a region not including any light-emitting substance therebetween. For example, between a fluorescent layer and a phosphorescent layer, a region that contains the same material as the fluorescent layer or phosphorescent layer (for example, a host material or an assist material) and no light-emitting substance may be provided. This facilitates the fabrication of the light-emitting element and reduces the drive voltage.

The light-emitting element 120 may be a single element including one EL layer or a tandem element in which a plurality of EL layers are stacked with a charge-generation layer therebetween.

The conductive film that can be used for the conductive layer 114 or the like and transmits visible light can be formed using, for example, indium oxide, indium tin oxide, indium zinc oxide, zinc oxide, or zinc oxide to which gallium is added. Alternatively, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like formed thin enough to have a light-transmitting property can be used. A stacked-layer film of any of the above materials can be used as a conductive layer. For example, a stacked-layer film of indium tin oxide and an alloy of silver and magnesium is preferably used, in which case conductivity can be increased. Further alternatively, graphene or the like may be used.

For the conductive film reflecting visible light that can be used for the reflective layer 112, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the above metal material or alloy. Alternatively, an alloy (an aluminum alloy) containing aluminum and titanium, nickel, or neodymium may be used. Alternatively, an alloy containing silver and copper, palladium, or magnesium may be used. An alloy containing silver and copper is preferable because of its high heat resistance. Furthermore, when a metal film or a metal oxide film is stacked in contact with an aluminum film or an aluminum alloy film, oxidation can be inhibited. Examples of a material for the metal film or the metal oxide film include titanium or titanium oxide. Alternatively, the above conductive film that transmits visible light and a film containing a metal material may be stacked. For example, a stacked-layer film of silver and indium tin oxide or a stacked-layer film of an alloy of silver and magnesium and indium tin oxide can be used.

It is preferable that the reflective layer 112 include, in a portion positioned on the EL layer 115 side, the above conductive film that reflects visible light. Furthermore, a conductive metal oxide film is preferably stacked over the conductive film reflecting visible light, in which case oxidization, corrosion, or the like of the conductive film reflecting visible light can be inhibited.

As the insulating layer 113, a material that is high in a light-transmitting property is preferably used. For example, a single layer or stacked layers of an inorganic insulating film such as a silicon oxide film, a silicon oxynitride film, an aluminum oxide film, or a hafnium oxide film can be used. Using a material with a high refractive index (e.g., 1.4 or higher, preferably 1.5 or higher) for the insulating layer 113 can reduce the physical thickness and can increase the productivity.

As the conductive film having a light-transmitting property and a reflective property that can be used for the conductive layer 116, the conductive film reflecting visible light formed to be thin enough to transmit visible light can be used. In addition, with the stacked-layer structure of the conductive film and the conductive film transmitting visible light, the conductivity, the mechanical strength, or the like can be increased.

The conductive film having a light-transmitting property and a reflective property preferably has a reflectance with respect to visible light (e.g., the reflectance with respect to light having a specific wavelength within the range of 400 nm to 700 nm) of higher than or equal to 20% and lower than or equal to 80%, preferably higher than or equal to 40% and lower than or equal to 70%. The conductive film having a reflective property preferably has a reflectance with respect to visible light of higher than or equal to 40% and lower than or equal to 100%, further preferably higher than or equal to 70% and lower than or equal to 100%. The conductive film having a light-transmitting property preferably has a reflectance with respect to visible light of higher than or equal to 0% and lower than or equal to 40%, further preferably higher than or equal to 0% and lower than or equal to 30%.

As the conductive layer 111 functioning as the lower electrode, a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be used. These materials can suitably be used for the conductive film of the plug 130.

The electrodes included in the light-emitting elements may each be formed by an evaporation method, a sputtering method, or the like. Alternatively, a discharging method such as an inkjet method, a printing method such as a screen printing method, or a plating method may be used for the formation.

Note that the aforementioned light-emitting layer and layers containing a substance with a high hole-injection property, a substance with a high hole-transport property, a substance with a high electron-transport property, a substance with a high electron-injection property, and a substance with a bipolar property may include an inorganic compound such as a quantum dot or a high molecular compound (e.g., an oligomer, a dendrimer, and a polymer). For example, when used for the light-emitting layer, the quantum dots can function as a light-emitting substance.

As the quantum dot material, a colloidal quantum dot material, an alloyed quantum dot material, a core-shell quantum dot material, a core quantum dot material, or the like can be used. The material containing elements belonging to Groups 12 and 16, elements belonging to Groups 13 and 15, or elements belonging to Groups 14 and 16, may be used. Alternatively, the quantum dot material containing an element such as cadmium, selenium, zinc, sulfur, phosphorus, indium, tellurium, lead, gallium, arsenic, or aluminum may be used.

In each of the light-emitting elements, the optical distance between the surface of the reflective layer 112 reflecting visible light and the conductive layer 116 having a transmitting property and a reflective property with respect to visible light is preferably adjusted to be $m \times \lambda/2$ (m is a natural number) or in the vicinity thereof, where $\lambda$ is the wavelength of light whose intensity is desired to be increased.

Note that, the above-described optical distance actually depends on a product of the physical distance between the reflective surface of the reflective layer 112 and the reflective surface of the conductive layer 116 having a light-transmitting property and a reflective property and the refractive index of a layer provided therebetween, and thus it is difficult to precisely adjust the optical distance. Thus, it is preferable to adjust the optical distance on the assumption that the surface of the reflective layer 112 and the surface of the conductive layer 116 having a light-transmitting property and a reflective property are each the reflective surface.

Manufacturing Method Example

An example of a manufacturing method of the display device of one embodiment of the present invention will be described with reference to drawings.

Note that thin films that form the display device (insulating films, semiconductor films, conductive films, or the like) can be formed by a sputtering method, a chemical vapor deposition (CVD) method, a vacuum evaporation method, a pulsed laser deposition (PLD) method, an atomic layer deposition (ALD) method, or the like. Examples of the CVD method include a plasma-enhanced chemical vapor deposition (PECVD: Plasma Enhanced CVD) method and a thermal CVD method. As an example of the thermal CVD method, a metal organic chemical vapor deposition (MOCVD: Metal Organic CVD) method can be given.

Thin films that form the display device (insulating films, semiconductor films, conductive films, or the like) can also be formed by a method such as spin coating, dipping, spray coating, ink-jetting, dispensing, screen printing, offset printing, a doctor knife, a slit coater, a roll coater, a curtain coater, and a knife coater.

When the thin films that form the display device are processed, a photolithography method or the like can be used. Besides, a nanoimprinting method, a sandblasting method, a lift-off method, or the like may be used for the processing of the thin films. Island-shaped thin films may be directly formed by a deposition method using a blocking mask such as a metal mask.

There are two typical examples of a photolithography method. In one of the methods, a resist mask is formed over a thin film that is to be processed, the thin film is processed by etching or the like, and the resist mask is removed. In the other method, after a photosensitive thin film is formed, exposure and development are performed, so that the thin film is processed into a desired shape.

As the light used for exposure in the photolithography method, for example, an i-line (with a wavelength of 365 nm), a g-line (with a wavelength of 436 nm), an h-line (with a wavelength of 405 nm), or combined light of any of them can be used. Besides, ultraviolet light, KrF laser light, ArF laser light, or the like can be used. Exposure may be performed by liquid immersion exposure technique. As the light used for the exposure, extreme ultraviolet (EUV) light or X-rays may be used. Furthermore, instead of the light used for the exposure, an electron beam can also be used. It is preferable to use extreme ultraviolet light, X-rays, or an electron beam because extremely minute processing can be performed. Note that in the case where exposure is performed by scanning of a beam such as an electron beam, a photomask is not needed.

For etching of the thin film, a dry etching method, a wet etching method, a sandblasting method, or the like can be used.

For the thin film planarization treatment, a polishing method such as a chemical mechanical polishing (CMP) method or the like can be suitably used. Alternatively, dry etching treatment or plasma treatment may be used. Note that, polishing treatment, dry etching treatment, or plasma treatment may be performed a plurality of times, or these treatments may be performed in combination. In the case where the treatments are performed in combination, the order of steps is not particularly limited and may be set as appropriate depending on the roughness of the surface to be processed.

To process a thin film to have a desired thickness with high precision, a CMP method is used, for example. In that case, polishing is performed at a constant processing rate until part of the top surface of the thin film is exposed. Then, polishing is performed at a lower processing rate until the thin film has a desired thickness, so that highly precise processing can be performed.

Examples of a method for detecting the end of the polishing include an optical method in which the surface of the formation surface is irradiated with light and a change in the reflected light is detected; a physical method in which a change in the polishing resistance received by the processing apparatus from the formation surface is detected; and a method in which a magnetic line is applied to the formation surface and a change in the magnetic line due to the generated eddy current is used.

After the top surface of the thin film is exposed, polishing treatment is performed at a low processing rate while the thickness of the thin film is monitored by an optical method using a laser interferometer or the like, whereby the thickness of the thin film can be controlled with high precision. Note that the polishing treatment may be performed a plurality of times until the thin film has a desired thickness, as necessary.

Manufacturing Method Example 1

An example of a manufacturing method of the display device will be described below, using as an example the display device 100E described in the above structure example.

[Preparation of Substrate 101]

As the substrate 101, a substrate having at least heat resistance high enough to withstand the following heat treatment can be used. Examples of an insulating substrate used as the substrate 101 include a glass substrate, a quartz substrate, a sapphire substrate, and a ceramic substrate. Alternatively, a single crystal semiconductor substrate using silicon or silicon carbide, a polycrystalline semiconductor substrate, a compound semiconductor substrate of silicon germanium or the like, a semiconductor substrate such as an SOI substrate, or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like, for example. In addition to the above, an arithmetic circuit, a memory circuit, or the like may be formed.

In this embodiment, a substrate including at least a pixel circuit is used as the substrate 101.

{Formation of Insulating Layer 121, Plug 131, and Conductive Layer 111}

An insulating film to be the insulating layer 121 is formed over the substrate 101. Next, an opening reaching the substrate 101 is formed in the insulating layer 121 in a position where the plug 131 is to be formed. The opening is preferably an opening reaching an electrode or a wiring provided in the substrate 101. Then, a conductive film is formed to fill the opening and planarization treatment is performed to expose a top surface of the insulating layer 121. In this manner, the plug 131 embedded in the insulating layer 121 can be formed.

A conductive film is formed over the insulating layer 121 and the plug 131 and an unnecessary portion is removed by etching to leave a portion overlapping with the plug 131, whereby the conductive layer 111 electrically connected to the plug 131 is formed (FIG. 4A).

{Formation of Reflective Layer 112 and Insulating Layer 113}

A conductive film 112f to be the reflective layer 112 is formed to cover the insulating layer 121 and the conductive layer 111. Next, an insulating film 113f to be the insulating layer 113 is formed over the conductive film 112f Next, a resist mask 151 is formed over the insulating film 113f (FIG. 4B). The resist mask 151 is formed in a portion where the reflective layer 112 and the insulating layer 113 are present later. The resist mask 151 is preferably formed on an inner side than the end portions of the conductive layer 111. After that, the conductive film 112f and the insulating film 113f not covered with the resist mask 151 are removed by etching, whereby the reflective layer 112 and this insulating layer 113 can be formed. Then, heat treatment in an atmosphere containing oxygen, in particular, heat treatment in an air atmosphere (also referred to as air baking) or plasma treatment in an atmosphere containing oxygen (also referred to as ashing) is performed, and treatment to stabilize the end portions of the insulating layer 113 or the reflective layer 112 may be additionally performed.

{Formation of Conductive Layer 114R, Conductive Layer 114G, and Conductive Layer 114B}

A conductive film 143f to be the conductive layer 143 later is formed over the conductive layer 111, the insulating layer 113, and the insulating layer 121. Next, a resist mask 152 is formed over the conductive film 143f (FIG. 4C). The resist mask 152 is formed in a portion where the conductive layer 114R is present later. After that, the conductive film 143f not covered with the resist mask 152 is removed by etching, whereby the conductive layer 143 can be formed.

Next, a conductive film 142f to be the conductive layer 142 later is formed over the conductive layer 111, the insulating layer 113, the conductive layer 143, and the insulating layer 121, and a resist mask 153 is formed over the conductive film 142f (FIG. 4D). The resist mask 153 is provided to cover a portion of the conductive film 142f overlapping with the conductive layer 143 and a portion to be the conductive layer 114G later. After that, the conductive film 142f is etched in a manner similar to the above, whereby the conductive layer 142 can be formed.

Next, a conductive film 141f to be the conductive layer 141 later is formed over the conductive layer 111, the insulating layer 113, the conductive layer 142, and the insulating layer 121, and a resist mask 154 is formed over the conductive film 141f (FIG. 4E). The resist mask 154 is provided to cover a portion of the conductive film 141f overlapping with the conductive layer 142 and a portion to be the conductive layer 114B later. After that, the conductive film 141f is etched in a manner similar to the above, whereby the conductive layer 141 can be formed.

Figure 5A:
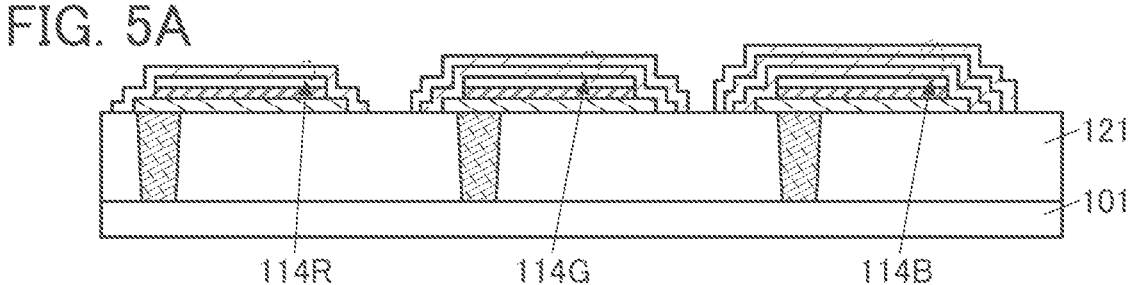
FIG. 5A to FIG. 5C are diagrams illustrating an example of a manufacturing method of a display device.

Through the above steps, the conductive layer 114R, the conductive layer 114G, and the conductive layer 114B can be formed (FIG. 5A).

Although in FIG. 4C, the resist mask 152 is formed such that the end portion of the resist mask 152 covers the end portion of the conductive layer 111, the resist mask 152 may be formed such that its end portion is aligned with the end portion of the reflective layer 112. The same applies to the positional relationship between the resist mask 153 and the reflective layer 112. Note that the resist mask 154 is formed such that the end portion of the resist mask 154 is aligned with the end portion of the conductive layer 111. Alternatively, the resist mask is formed such that the end portion of the resist mask 154 covers the end portion of the conductive layer 111. In that case, the shape of the conductive layer 143 to be formed has a shape covering the end portion of the conductive layer 111, as illustrated in FIG. 5A. With such a structure, the conductive layer 111 and the conductive layer 114 are electrically connected to each other.

[Formation of Insulating Layer 117]

Figure 5B:
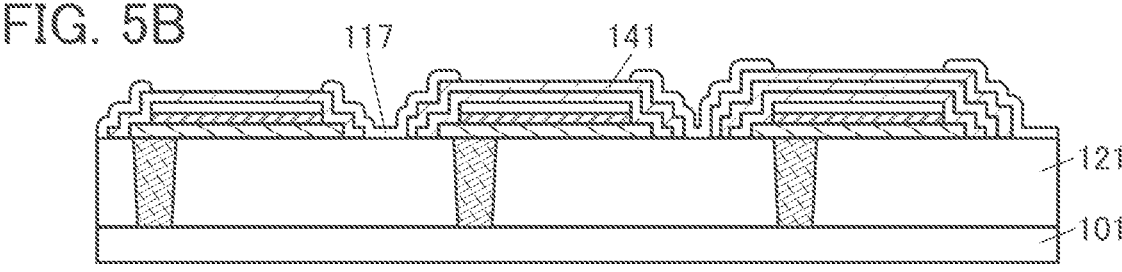

Next, an insulating film is formed to cover the conductive layer 141 and the insulating layer 121, and an unnecessary portion is removed by etching, whereby the insulating layer 117 covering the end portion of the conductive layer 141 is formed (FIG. 5B). In addition, the end portion of the insulating layer 117 over the conductive layer 114 is preferably processed into a tapered shape. The taper angle of the end portion of the insulating layer 117 (an angle between the formation surface and the end surface) is greater than 0° and less than or equal to 60°, preferably greater than or equal to 5° and less than or equal to 45°, further preferably greater than or equal to 5° and less than or equal to 30°.

The insulating layer 117 can be formed using an organic insulating film or an inorganic insulating film. In particular, in the case of a display device with ultra-high resolution (e.g., 2000 ppi or higher), an inorganic insulating film is preferably used.

{Formation of EL Layer 115 and Conductive Layer 116}

Figure 5C:
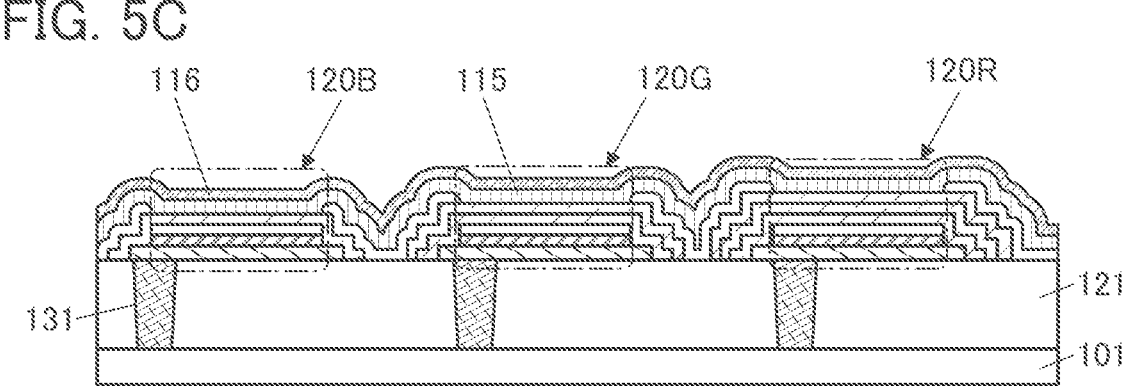

Next, the EL layer 115 and the conductive layer 116 are formed in this order over the conductive layer 141 and the insulating layer 117, whereby the light-emitting element 120 is formed (FIG. 5C).

The EL layer 115 includes at least a layer containing a light-emitting compound. A structure may be employed in which an electron-injection layer, an electron-transport layer, a charge-generation layer, a hole-transport layer, and a hole-injection layer are stacked in addition to the above. The EL layer 115 can be formed by, for example, a liquid phase method such as an evaporation method or an inkjet method.

The conductive layer 116 is formed to have a transmitting property and a reflective property with respect to visible light. For example, a metal film or an alloy film that is thin enough to transmit visible light can be used. Alternatively, a light-transmitting conductive film (e.g., a metal oxide film) may be stacked over such a film.

In the above manner, the light-emitting element 120R, the light-emitting element 120G, and the light-emitting element 120B that have different optical distances can be formed.

According to the above manufacturing method example, the difference in optical distance among the light-emitting elements can be precisely controlled by the thicknesses of the conductive layers 114; thus, chromaticity deviation in the light-emitting elements is unlikely to occur, so that a display device having excellent color reproducibility and extremely high display quality can be manufactured easily.

The light-emitting element 120 can be formed over an insulating layer with a planarized top surface. Furthermore, the lower electrode (the conductive layer 111) of the light-emitting element 120 can be electrically connected to a pixel circuit or the like of the substrate 101 through the plug 131, so that an extremely minute pixel can be formed and accordingly a display device with extremely high resolution can be achieved. In addition, since the light-emitting element 120 can be placed to overlap with the pixel circuit or the driver circuit, a display device with a high aperture ratio (effective light-emitting area ratio) can be achieved.

Manufacturing Method Example 2

An example of a manufacturing method of the display device will be described below, using as an example the display device 100F described in the above structure example 1. Note that the manufacturing method example 1 described above is referred to for portions that are the same as those described in manufacturing method example 1, and description of the portions is omitted in some cases.

{Preparation for Substrate 101}

Similarly to the above, a substrate including at least a pixel circuit is used as the substrate 101. {Formation of insulating layer 121 and plug 131}Next, the insulating layer 121 and the plug 131 are formed. The insulating layer 121 and the plug 131 can be formed by methods similar to those described above.

{Deposition of Conductive Layer 111, Reflective Layer 112, and Insulating Layer 113}

Figure 6A:
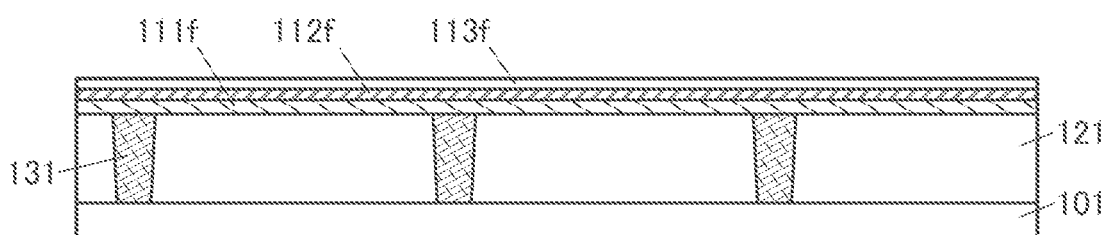
FIG. 6A to FIG. 6E are diagrams illustrating an example of a manufacturing method of a display device.

A conductive film 111$f$ to be the conductive layer 111, the conductive film 112$f$ to be the reflective layer 112, and the insulating film 113$f$ to be the insulating layer 113 are formed in this Order Over the Insulating Layer 121 and the Plug 131 (FIG. 6A).

{Formation of plug 130}

Figure 6B:
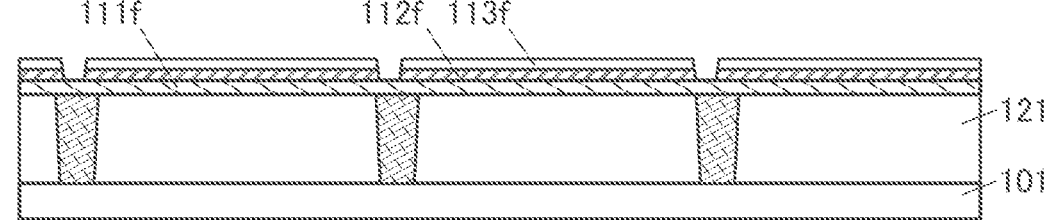
Figure 6C:
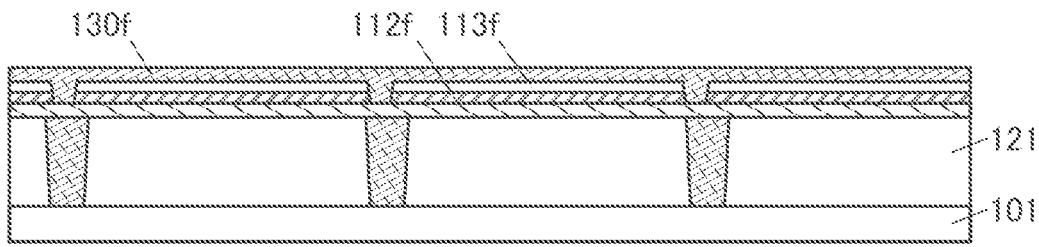

An opening reaching the conductive film 111$f$ is formed in the conductive film 112$f$ and the insulating film 113$f$, at a position where the plug 130 is formed (FIG. 6B). Note that although the opening is formed by etching the conductive film 112$f$ and the insulating film 113$f$ in FIG. 6B, an opening reaching the conductive film 112$f$ may be formed by etching the insulating film 113$f$ Next, a conductive film 130$f$ to be the plug 130 is formed to fill the opening (FIG. 6C).

Figure 6D:
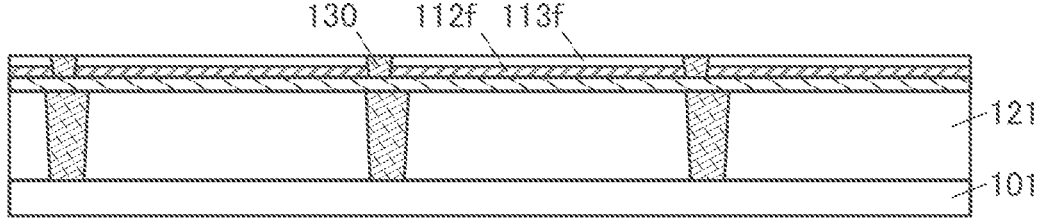

After that, planarization treatment is performed until the top surface of the insulating film 113$f$ is exposed, whereby the insulating film 113$f$ whose top surface is planarized and the plug 130 embedded in the insulating film 113$f$ and the conductive film 112$f$ can be formed (FIG. 6D).

At this time, due to uneven shape of the top surface of the insulating film 113$f$, part of the conductive film 130$f$ might remain over the top surface of the insulating film 113$f$ after the planarization treatment. Thus, the insulating film 113$f$ is formed to have enough thickness in advance, and additional planarization treatment is performed after the top surface of the insulating film 113$f$ is exposed in the planarization treatment, whereby the remaining film of the conductive film 130$f$ can be suitably removed.

{Formation of Conductive Layer 114R, Conductive Layer 114G, and Conductive Layer 114B}

Figure 6E:
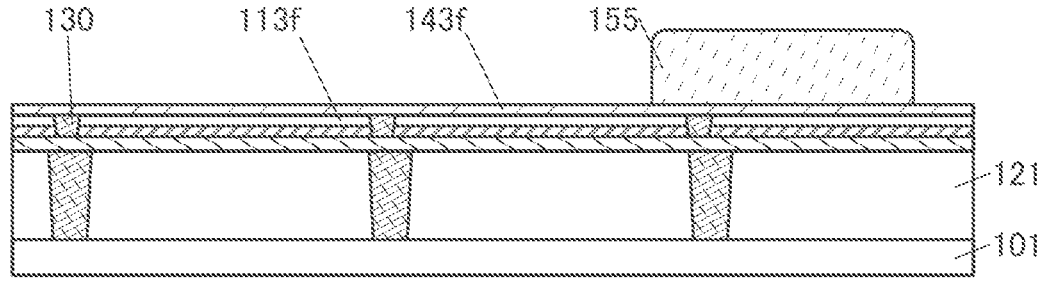

First, the conductive film 143$f$ to be the conductive layer 143 is formed to cover the insulating film 113$f$ and the plug 130. Next, a resist mask 155 is formed over the conductive film 143$f$ (FIG. 6E). The resist mask 155 is formed in a portion where the conductive layer 114R is present later. After that, the conductive film 143$f$ not covered with the resist mask 155 is removed by etching, whereby the conductive layer 143 can be formed.

Next, the conductive film 142$f$ to be the conductive layer 142 is formed to cover the insulating film 113$f$ and the conductive layer 143, and a resist mask 156 is formed over the conductive film 142$f$ (FIG. 7A). The resist mask 156 is provided to cover a portion of the conductive film 142$f$ overlapping with the conductive layer 143 and a portion to be the conductive layer 114G later. After that, the conductive film 142*f* is etched in a manner similar to the above, whereby the conductive layer 142 can be formed.

Next, the conductive film 141*f* to be the conductive layer 141 is formed to cover the insulating film 113*f* and the conductive layer 142, and a resist mask 157 is formed over the conductive film 141*f* (FIG. 7B). The resist mask 157 is provided to cover a portion of the conductive film 141*f* overlapping with the conductive layer 142 and a portion to be the conductive layer 114B later. After that, the conductive film 141*f*, the conductive layer 142, the conductive layer 143, the conductive film 111*f*, the conductive film 112*f*, and the insulating film 113*f* that are not covered with the resist mask 157 are etched, whereby the conductive layer 141, the conductive layer 111, the reflective layer 112, and the insulating layer 113 can be formed.

Through the above steps, the conductive layer 114R, the conductive layer 114G, the conductive layer 114B, the conductive layer 111, the reflective layer 112, and the insulating layer 113 can be formed (FIG. 7C).

{Formation of Insulating Layer 117}

Next, an insulating film is formed to cover the conductive layer 114R, the conductive layer 114G, the conductive layer 114B, the insulating layer 113, the reflective layer 112, the conductive layer 111, and the insulating layer 121, and then an unnecessary portion of the insulating film is removed by etching, whereby the insulating layer 117 covering the end portions of the conductive layer 114R, the conductive layer 114G, the conductive layer 114B, the insulating layer 113, the reflective layer 112, and the conductive layer 111 is formed (FIG. 7D). The end portion of the insulating layer 117 over the conductive layer 114 is preferably processed into a tapered shape. The taper angle of the end portion of the insulating layer 117 (an angle between the formation surface and the end surface) is greater than 0° and less than or equal to 60°, preferably greater than or equal to 5° and less than or equal to 45°, further preferably greater than or equal to 5° and less than or equal to 30°.

The insulating layer 117 can be formed using an organic insulating film or an inorganic insulating film. In particular, in the case of a display device with ultra-high resolution (e.g., 2000 ppi or higher), an inorganic insulating film is preferably used.

{Formation of EL Layer 115 and Conductive Layer 116}

Next, the EL layer 115 and the conductive layer 116 are formed in this order over the conductive layer 141 and the insulating layer 117, whereby the light-emitting element 120 is formed (FIG. 7E). The light-emitting element 120R, the light-emitting element 120G, and the light-emitting element 120B having different optical distances can be formed by a method similar to the above-described method.

By the above manufacturing method, a display device with extremely high display quality can be easily manufactured.

The light-emitting element 120 can be formed over an insulating layer with a planarized top surface. The light-emitting element 120 has a structure in which the light-emitting element 120 is electrically connected to the conductive layer 114 and the lower electrode (the conductive layer 111) through the plug 130 in the light-emitting element. Furthermore, the lower electrode of the light-emitting element 120 can be electrically connected to a pixel circuit or the like of the substrate 101 through the plug 131, so that an extremely minute pixel can be formed and accordingly a display device with extremely high resolution can be achieved. In addition, since the light-emitting element 120 can be placed to overlap with the pixel circuit or the driver circuit, a display device with a high aperture ratio (effective light-emitting area ratio) can be achieved.

Modification Example

A modification example with a structure partly different from the above display device will be described below.

Figure 8A:
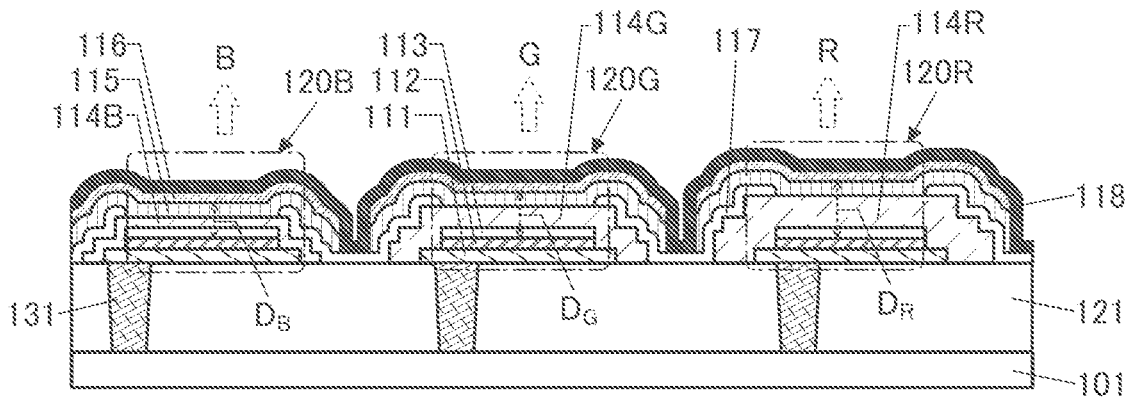
FIG. 8A and FIG. 8B are each a diagram illustrating a structure example of a display device.

FIG. 8A is a schematic cross-sectional view of a display device 100G. The display device 100G is different from the above display device 100A mainly in that the shapes of the EL layer 115 and the conductive layer 116 are different and that an insulating layer 118 is included.

In the display device 100G, the EL layer 115 and the conductive layer 116 are divided between adjacent light-emitting elements with different colors. This can prevent current flowing through the EL layer 115 between the adjacent light-emitting elements with different colors (such current is also referred to as leakage current). Thus, light emission due to the leakage current can be suppressed, which enables display with high contrast. Furthermore, a highly conductive material can be used for the EL layer 115 even in the case where resolution is increased, which can expand the range of choices for the materials and makes it easier to improve the efficiency, power consumption, and reliability.

Island-like patterns of the EL layer 115 and the conductive layer 116 may be formed by deposition using a shadow mask such as a metal mask; however, a processing method without the use of a metal mask is particularly preferable. Such a method enables extremely minute patterns to be formed, and thus, the resolution and aperture ratio can be improved, as compared with a formation method with the use of a metal mask. As the processing method, a photolithography method can typically be used. Other formation methods include a nanoimprinting method, a sandblast method, and the like.

In this specification and the like, a device formed using a metal mask or an FMM (fine metal mask, or a high-resolution metal mask) may be referred to as an MM (metal mask) structure. In this specification and the like, a device formed without using a metal mask or an FMM may be referred to as an MML (metal maskless) structure.

As a method for manufacturing the display device 100G, first, the EL layer 115 and the conductive layer 116 are deposited without using a metal mask, and then a resist mask is formed over the conductive layer 116. After that, portions of the EL layer 115 and the conductive layer 116 which are not covered with the resist mask are removed by etching, and the resist mask is removed. Then, the insulating layer 118 is formed. Through the above steps, the display device 100G can be manufactured.

In the display device 100G, the insulating layer 118 is provided to cover the light-emitting element 120B, the light-emitting element 120G, and the light-emitting element 120R. A portion of the insulating layer 118 is in contact with the top surface of the insulating layer 117 between adjacent light-emitting elements. The insulating layer 118 functions as a protective layer that prevents diffusion of impurities such as water into the light-emitting element. As the insulating layer 118, it is preferable to use an inorganic insulating film with low moisture permeability, such as a silicon oxide film, a silicon nitride film, or an aluminum oxide film.

Figure 8B:
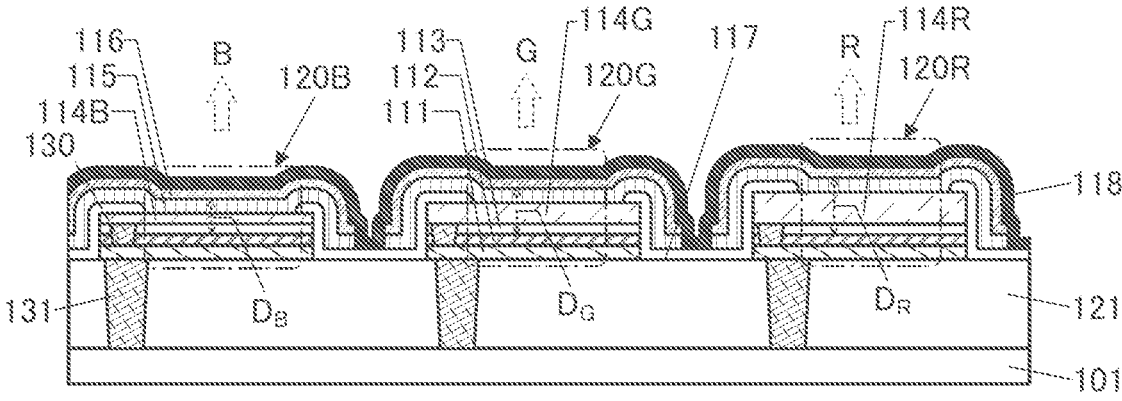

A display device 100H shown in FIG. 8B is an example of the case where the EL layer 115 and the conductive layer 116 of the display device 100C are processed.

In the display device 100G and the display device 100H, the EL layer 115 and the conductive layer 116 are preferably processed such that they are not divided between but extend across pixels that emit the same color. The EL layer 115 and the conductive layer 116 can be processed into a stripe shape, for example. In this manner, the conductive layer 116 of all the light-emitting elements can be supplied with a predetermined potential without going into a floating state.

The above is the description of the modification example.

Structure Example 2

A more specific example of the display device including a transistor will be described below.

Structure Example 2-1

Figure 9:
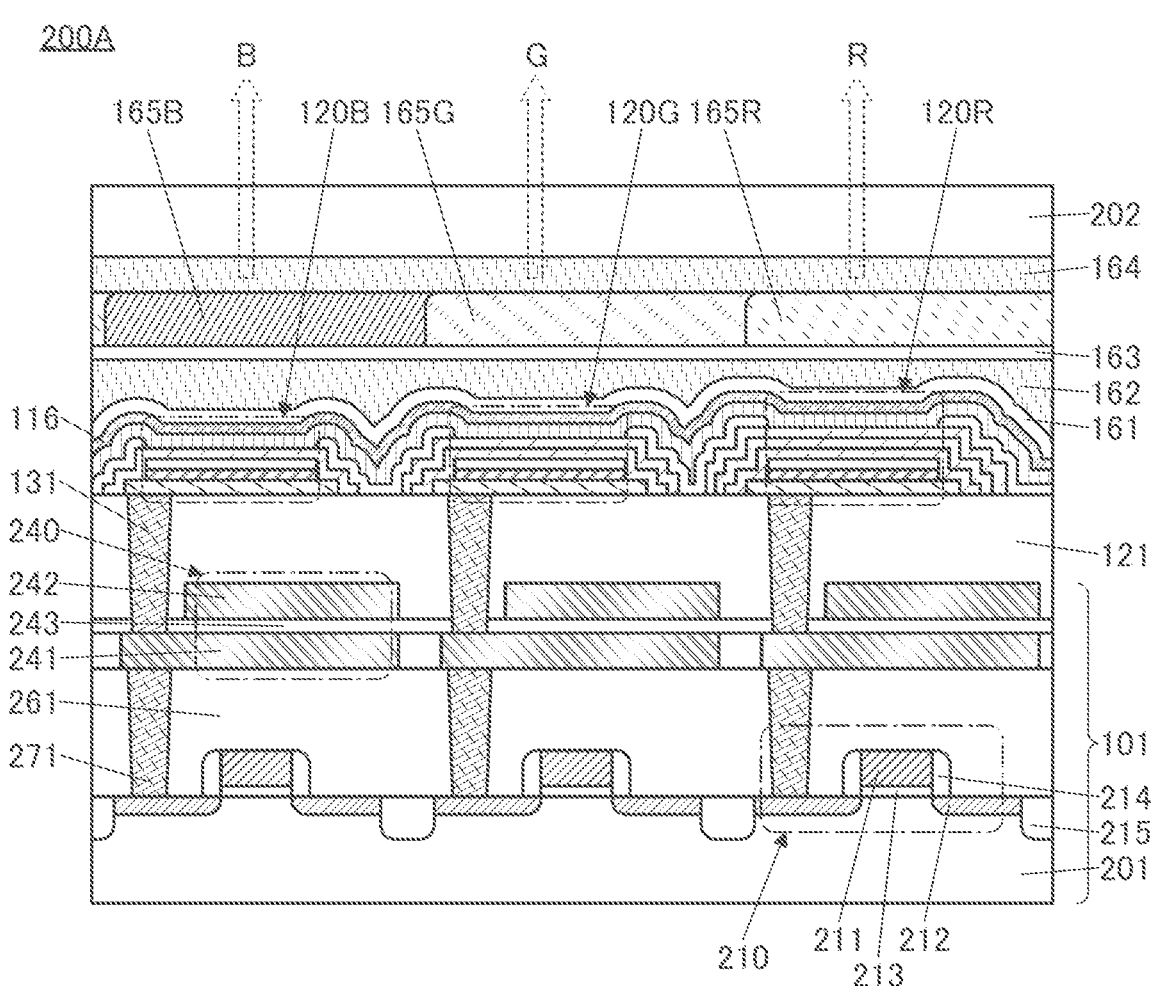
FIG. 9 is a diagram illustrating a structure example of a display device.

FIG. 9 is a schematic cross-sectional view of a display device 200A.

The display device 200A includes a substrate 201, a light-emitting element 120R, a light-emitting element 120G, a light-emitting element 120B, a capacitor 240, a transistor 210, and the like.

A stacked-layer structure from the substrate 201 to the capacitor 240 corresponds to the substrate 101 in the above structure example 1.

The transistor 210 is a transistor whose channel region is formed in a substrate 201. As the substrate 201, a semiconductor substrate such as a single crystal silicon substrate can be used, for example. The transistor 210 includes part of the substrate 201, a conductive layer 211, a low-resistance region 212, an insulating layer 213, an insulating layer 214, and the like. The conductive layer 211 functions as a gate electrode. The insulating layer 213 is positioned between the substrate 201 and the conductive layer 211 and functions as a gate insulating layer. The low-resistance region 212 is a region where the substrate 201 is doped with an impurity, and functions as one of a source and a drain. The insulating layer 214 is provided to cover a side surface of the conductive layer 211 and functions as an insulating layer.

In addition, an element isolation layer 215 is provided between two adjacent transistors 210 to be embedded in the substrate 201.

Furthermore, an insulating layer 261 is provided to cover the transistor 210, and the capacitor 240 is provided over the insulating layer 261.

The capacitor 240 includes a conductive layer 241, a conductive layer 242, and an insulating layer 243 positioned therebetween. The conductive layer 241 functions as one electrode of the capacitor 240, the conductive layer 242 functions as the other electrode of the capacitor 240, and the insulating layer 243 functions as a dielectric of the capacitor 240.

The conductive layer 241 is provided over the insulating layer 261 and is electrically connected to one of the source and the drain of the transistor 210 through a plug 271 embedded in the insulating layer 261. The insulating layer 243 is provided to cover the conductive layer 241. The conductive layer 242 is provided in a region overlapping with the conductive layer 241 with the insulating layer 243 therebetween.

The insulating layer 121 is provided to cover the capacitor 240, and the light-emitting element 120R, the light-emitting element 120G, the light-emitting element 120B, and the like are provided over the insulating layer 121. In the example shown here, the structure described in the structure examples 1-3 and the structure illustrated in FIG. 3A is used as the structures of the light-emitting element 120R, the light-emitting element 120G, and the light-emitting element

120B; however, there is no limitation and a variety of structures described above can be employed.

In the display device 200A, an insulating layer 161, an insulating layer 162, and an insulating layer 163 are provided to cover the conductive layer 116 of the light-emitting element 120. These three insulating layers each function as a protective layer that prevents diffusion of impurities such as water into the light-emitting element 120. As the insulating layer 161 and the insulating layer 163, it is preferable to use an inorganic insulating film with low moisture permeability, such as a silicon oxide film, a silicon nitride film, or an aluminum oxide film. As the insulating layer 162, an organic insulating film having a high light-transmitting property can be used. Using an organic insulating film as the insulating layer 162 can reduce the influence of uneven shape below the insulating layer 162, so that the formation surface of the insulating layer 163 can be a smooth surface. Accordingly, a defect such as a pinhole is unlikely to be generated in the insulating layer 163, leading to higher moisture permeability of the protective layer. Note that the structure of the protective layer covering the light-emitting element 120 is not limited thereto, and a single layer or a two-layer structure may be employed or a stacked-layer structure of four or more layers may be employed.

A coloring layer 165R overlapping with the light-emitting element 120R, a coloring layer 165G overlapping with the light-emitting element 120G, and a coloring layer 165B overlapping with the light-emitting element 120B are provided over the insulating layer 163. For example, the coloring layer 165R transmits red light, the coloring layer 165G transmits green light, and the coloring layer 165B transmits blue light. This can increase the color purity of light from the light-emitting elements, so that a display device with higher display quality can be achieved. Furthermore, forming the coloring layers over the insulating layer 163 makes it easier to align the light-emitting units and the coloring layers than the case where the coloring layers are formed on a substrate 202 which is described later, so that a display device with extremely high resolution can be achieved.

The display device 200A includes the substrate 202 on the viewing side. The substrate 202 and the substrate 201 are bonded to each other with an adhesive layer 164 with a light-transmitting property. As the substrate 202, a substrate having a light-transmitting property such as a glass substrate, a quartz substrate, a sapphire substrate, or a plastic substrate can be used.

With such a structure, a display device with extremely high resolution and high display quality can be achieved.

Structure Example 2-2

Figure 10:
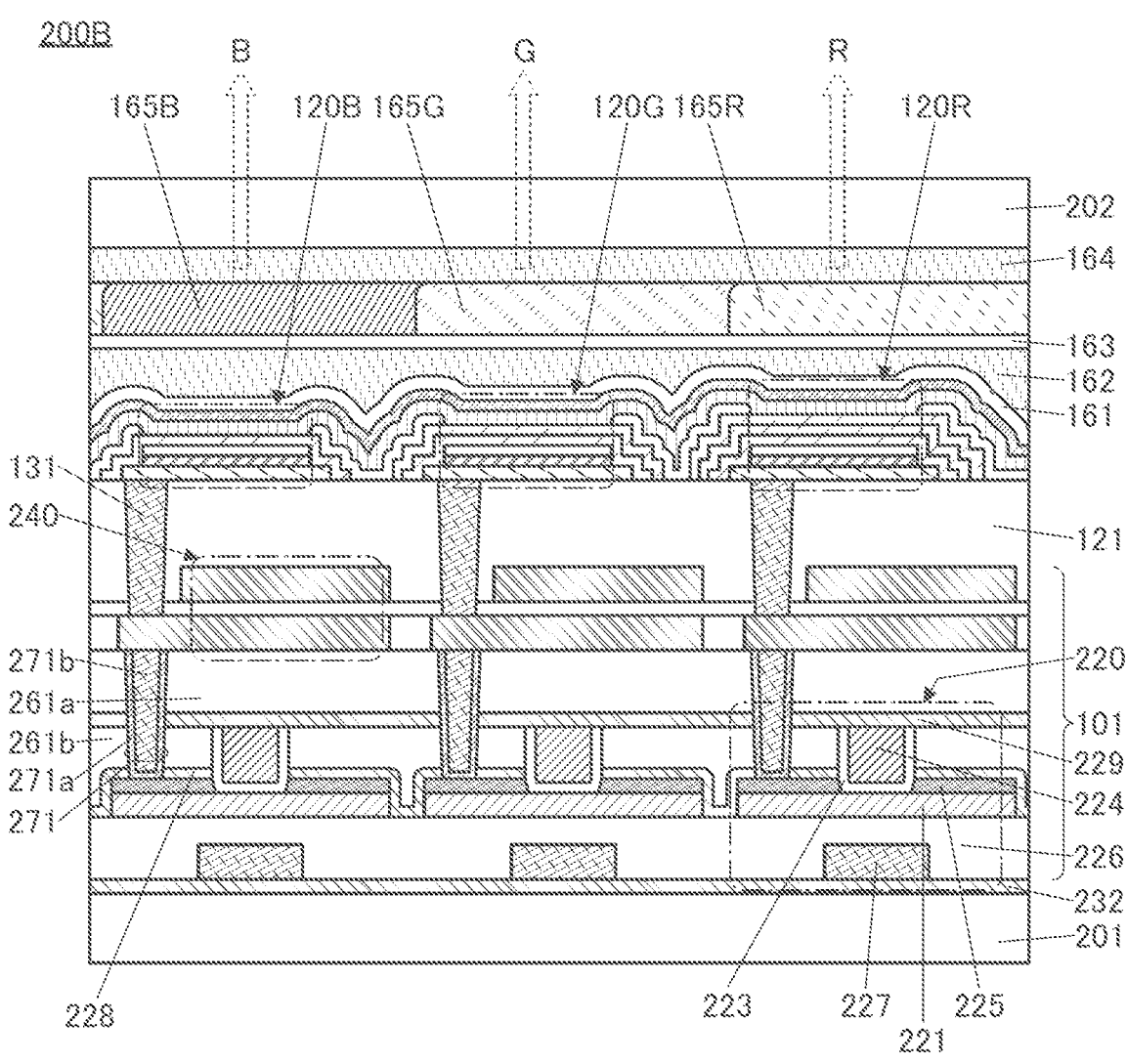
FIG. 10 is a diagram illustrating a structure example of a display device.

FIG. 10 is a schematic cross-sectional view of a display device 200B. The display device 200B is different from the above display device 200A mainly in a transistor structure.

A transistor 220 is a transistor in which a metal oxide (also referred to as an oxide semiconductor) is used in a semiconductor layer where a channel is formed.

The transistor 220 includes a semiconductor layer 221, an insulating layer 223, a conductive layer 224, a pair of conductive layers 225, an insulating layer 226, a conductive layer 227, and the like.

As the substrate 201 over which the transistor 220 is provided, the above-described insulating substrate or semiconductor substrate can be used.

An insulating layer 232 is provided over the substrate 201. The insulating layer 232 functions as a barrier layer that prevents diffusion of impurities such as water or hydrogen from the substrate 201 into the transistor 220 and release of oxygen from the semiconductor layer 221 to the insulating layer 232 side. As the insulating layer 232, it is preferable to use, for example, a film in which hydrogen or oxygen is unlikely to be diffused than in a silicon oxide film, such as an aluminum oxide film, a hafnium oxide film, and a silicon nitride film.

The conductive layer 227 is provided over the insulating layer 232, and the insulating layer 226 is provided to cover the conductive layer 227. The conductive layer 227 functions as a first gate electrode of the transistor 220, and part of the insulating layer 226 functions as a first gate insulating layer. For the insulating layer 226 at least in a portion in contact with the semiconductor layer 221, an oxide insulating film such as a silicon oxide film is preferably used. The top surface of the insulating layer 226 is preferably planarized.

The semiconductor layer 221 is provided over the insulating layer 226. The semiconductor layer 221 preferably includes a film of a metal oxide exhibiting semiconductor characteristics (also referred to as an oxide semiconductor). The material that can be suitably used for the semiconductor layer 221 is described in detail later.

The pair of conductive layers 225 is provided over and in contact with the semiconductor layer 221, and functions as a source electrode and a drain electrode.

An insulating layer 228 is provided to cover top and side surfaces of the pair of conductive layers 225, a side surface of the semiconductor layer 221, and the like, and an insulating layer 261b is provided over the insulating layer 228. The insulating layer 228 functions as a barrier layer that prevents diffusion of impurities such as water or hydrogen from the insulating layer 261b or the like to the semiconductor layer 221 and release of oxygen from the semiconductor layer 221. As the insulating layer 228, an insulating film similar to the insulating layer 232 can be used.

An opening reaching the semiconductor layer 221 is provided in the insulating layer 228 and the insulating layer 261b. The conductive layer 224 and the insulating layer 223, which is in contact with the side surfaces of the insulating layer 261b, the insulating layer 228, and the conductive layer 225, and the top surface of the semiconductor layer 221, are embedded in the opening. The conductive layer 224 functions as a second gate electrode, and the insulating layer 223 functions as a second gate insulating layer.

The top surface of the conductive layer 224, the top surface of the insulating layer 223, and the top surface of the insulating layer 261b are planarized so that they are substantially level with each other, and an insulating layer 229 and an insulating layer 261a are provided to cover these layers.

The insulating layer 261a and the insulating layer 261b function as interlayer insulating layers. The insulating layer 229 functions as a barrier layer that prevents diffusion of impurities such as water or hydrogen from the insulating layer 261a or the like to the transistor 220. As the insulating layer 229, an insulating film similar to the insulating layer 228 and the insulating layer 232 can be used.

The plug 271 electrically connected to one of the pair of conductive layers 225 is provided to be embedded in the insulating layer 261a, the insulating layer 229, and the insulating layer 261b. Here, the plug 271 preferably includes a conductive layer 271a covering side surfaces of the opening in each of the insulating layer 261a, the insulating layer 261b, the insulating layer 229, and the insulating layer 228, and part of the top surface of the conductive layer 225, and a conductive layer 271b in contact with the top surface of the conductive layer 271a. In this case, a conductive material in which hydrogen and oxygen are unlikely to be diffused is preferably used for the conductive layer 271a.

Structure Example 2-3

Figure 11:
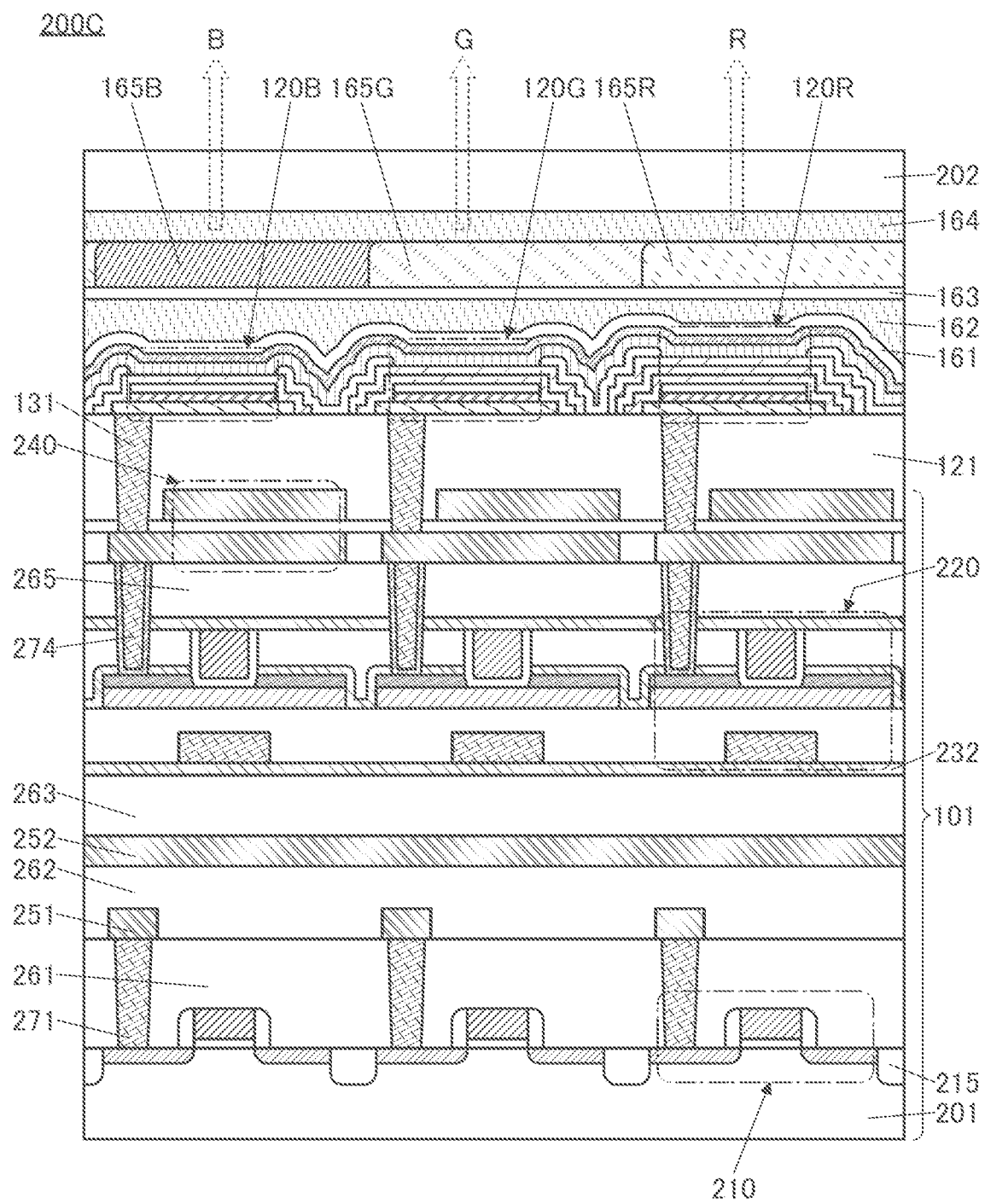
FIG. 11 is a diagram illustrating a structure example of a display device.

FIG. 11 is a schematic cross-sectional view of a display device 200C. The display device 200C has a structure in which the transistor 210 whose channel is formed in the substrate 201 and the transistor 220 including a metal oxide in the semiconductor layer where the channel is formed are stacked.

The insulating layer 261 is provided to cover the transistor 210 and the conductive layer 251 is provided over the insulating layer 261. In addition, an insulating layer 262 is provided to cover the conductive layer 251 and a conductive layer 252 is provided over the insulating layer 262. The conductive layer 251 and the conductive layer 252 each function as a wiring. An insulating layer 263 and the insulating layer 232 are provided to cover the conductive layer 252, and the transistor 220 is provided over the insulating layer 232. An insulating layer 265 is provided to cover the transistor 220, and the capacitor 240 is provided over the insulating layer 265. The capacitor 240 and the transistor 220 are electrically connected to each other through a plug 274.

The transistor 220 can be used as a transistor included in a pixel circuit. The transistor 210 can also be used as a transistor included in a pixel circuit or a transistor included in a driver circuit (a gate line driver circuit or a source line driver circuit) for driving the pixel circuit. The transistor 210 and the transistor 220 can also be used as transistors included in a variety of circuits such as an arithmetic circuit or a memory circuit.

With such a structure, not only the pixel circuit but also the driver circuit or the like can be formed directly under the light-emitting unit; thus, the display device can be downsized as compared with the case where the driver circuit is provided around a display region.

Structure Example 2-4

Figure 12:
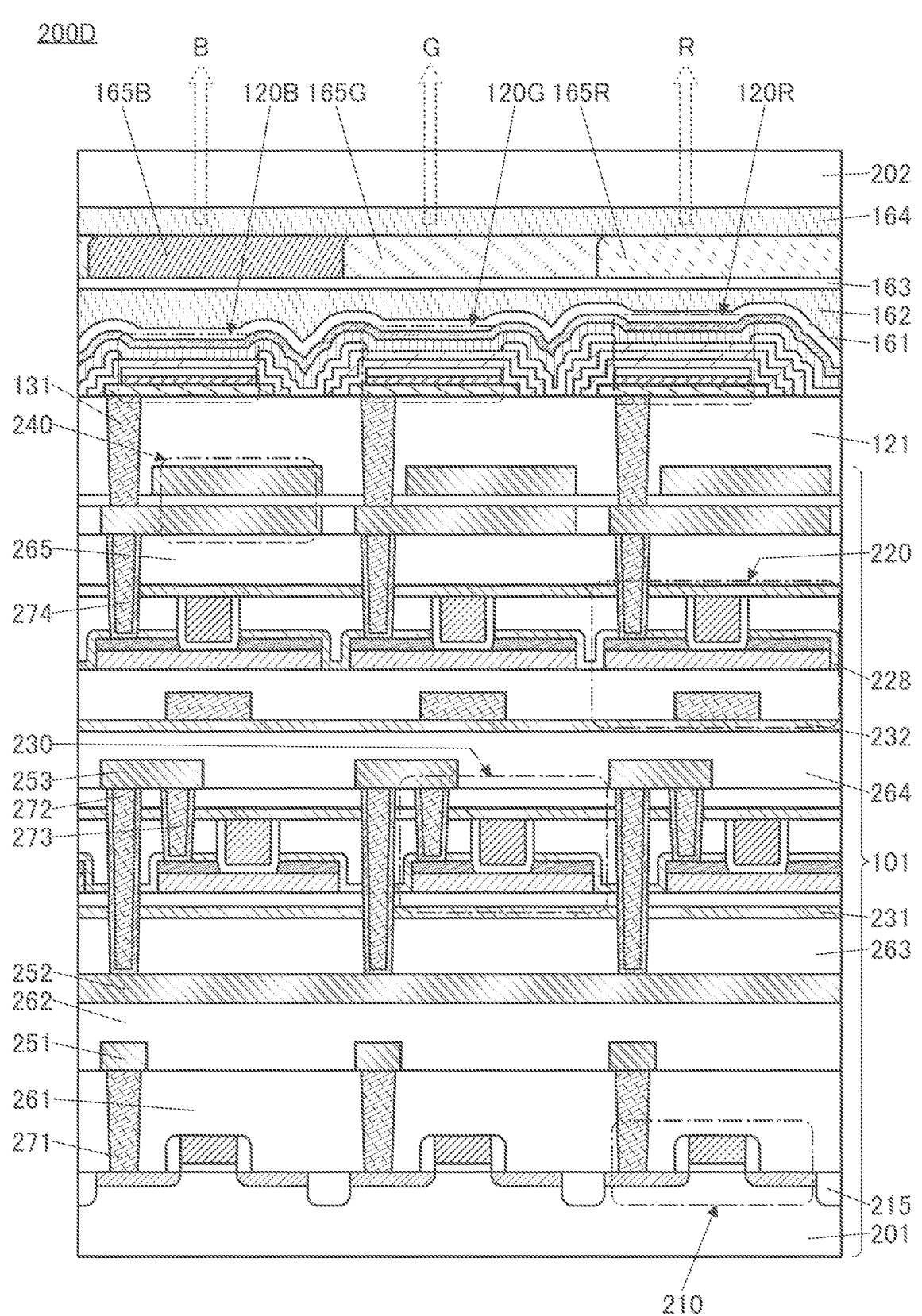
FIG. 12 is a diagram illustrating a structure example of a display device.

FIG. 12 is a schematic cross-sectional view of a display device 200D. The display device 200D is different from the display device 200C mainly in that two transistors using an oxide semiconductor are stacked.

The display device 200D includes a transistor 230 between the transistor 210 and the transistor 220. The transistor 230 has a structure similar to that of the transistor 220 except that the first gate electrode is not included. Note that the transistor 230 may include a first gate electrode.

The insulating layer 263 and an insulating layer 231 are provided to cover the conductive layer 252, and the transistor 230 is provided over the insulating layer 231. The transistor 230 and the conductive layer 252 are electrically connected to each other through a plug 273, a conductive layer 253, and a plug 272. An insulating layer 264 and the insulating layer 232 are provided to cover the conductive layer 253, and the transistor 220 is provided over the insulating layer 232.

The transistor 220 functions as, for example, a transistor for controlling current flowing through the light-emitting element 120. The transistor 230 functions as a selection transistor for controlling the selection state of a pixel. The transistor 210 functions as a transistor included in a driver circuit for driving the pixel, for example.

When three or more layers in which a transistor is formed are stacked in this manner, the area occupied by the pixel can be further reduced and a high-resolution display device can be achieved.

Components such as a transistor that can be used in the display device will be described below.

[Transistor]

The transistors each include a conductive layer functioning as the gate electrode, the semiconductor layer, a conductive layer functioning as the source electrode, a conductive layer functioning as the drain electrode, and an insulating layer functioning as the gate insulating layer.

Note that there is no particular limitation on the structure of the transistor included in the display device of one embodiment of the present invention. For example, a planar transistor, a staggered transistor, or an inverted staggered transistor may be used. A top-gate or a bottom-gate transistor structure may be employed. Gate electrodes may be provided above and below a channel.

There is no particular limitation on the crystallinity of a semiconductor material used for the transistors, and any of an amorphous semiconductor, a single crystal semiconductor, and a semiconductor having crystallinity other than single crystal (a microcrystalline semiconductor, a polycrystalline semiconductor, a single-crystal semiconductor, or a semiconductor partly including crystal regions) may be used. It is preferable that a single crystal semiconductor or a semiconductor having crystallinity be used, in which case deterioration of the transistor characteristics can be suppressed.

In particular, a transistor that uses a metal oxide film for a semiconductor layer where a channel is formed will be described below.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (M is a metal such as aluminum, titanium, gallium, germanium, yttrium, zirconium, lanthanum, cerium, tin, neodymium, or hafnium).

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratio of metal elements of the sputtering target in a range of ±40%. A metal oxide film with low carrier density is used as the semiconductor layer. For example, for the semiconductor layer, a metal oxide whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such a metal oxide is referred to as a highly purified intrinsic or substantially highly purified intrinsic metal oxide. The oxide semiconductor has a low density of defect states and can thus be referred to as a metal oxide having stable characteristics.

Note that, without limitation to those described above, an oxide semiconductor with an appropriate composition may be used in accordance with required semiconductor characteristics and electrical characteristics (e.g., field-effect mobility and threshold voltage) of the transistor. To obtain the required semiconductor characteristics of the transistor, it is preferable that the carrier density, the impurity concentration, the density of defect states, the atomic ratio between a metal element and oxygen, the interatomic distance, the density, and the like of the semiconductor layer be set to appropriate values.

When silicon or carbon, which is one of elements belonging to Group 14, is contained in the metal oxide contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is set to lower than or equal to $1\times10^{18}$ atoms/$cm^3$, preferably lower than or equal to $2\times10^{16}$ atoms/$cm^3$.

When nitrogen is contained in the metal oxide contained in the semiconductor layer, electrons serving as carriers are generated and the carrier density increases, so that the semiconductor layer easily becomes n-type. As a result, a transistor including a metal oxide that contains nitrogen is likely to be normally on. Hence, the concentration of nitrogen which is measured by secondary ion mass spectrometry is preferably set to lower than or equal to $5\times10^{18}$ atoms/$cm^3$.

Oxide semiconductors are classified into a single crystal oxide semiconductor and a non-single-crystal oxide semiconductor. Examples of the non-single-crystal oxide semiconductor include a CAAC-OS (c-axis-aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

A CAC-OS (cloud-aligned composite oxide semiconductor) may be used for a semiconductor layer of a transistor disclosed in one embodiment of the present invention.

The aforementioned non-single-crystal oxide semiconductor can be suitably used for a semiconductor layer of a transistor disclosed in one embodiment of the present invention. As the non-single-crystal oxide semiconductor, the nc-OS or the CAAC-OS can be suitably used.

In one embodiment of the present invention, a CAC-OS is preferably used for a semiconductor layer of a transistor. The use of the CAC-OS allows the transistor to have high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a layered structure including two or more of the above regions in some cases.

<Composition of CAC-OS>

The composition of a CAC-OS that can be used in a transistor disclosed in one embodiment of the present invention will be described below.

A CAC-OS refers to one composition of a material in which elements constituting a metal oxide are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in a metal oxide is hereinafter referred to as a mosaic pattern or a patch-like pattern.

Note that the metal oxide preferably contains at least indium. In particular, indium and zinc are preferably contained. In addition, one or more kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, CAC-OS in an In—Ga—Zn oxide (of the CAC-OS, an In—Ga—Zn oxide may be particularly referred to as CAC-IGZO) has a composition (hereinafter, referred to as cloud-like composition) in which materials are separated into indium oxide (hereinafter, $InO_{X1}$ (X1 is a real number greater than 0)) or indium zinc oxide (hereinafter, $In_{X2}Zn_{Y2}O_{Z2}$ (X2, Y2, and Z2 are real numbers greater than 0)), and gallium oxide (hereinafter, $GaO_{X3}$ (X3 is a real number greater than or gallium zinc oxide (hereinafter, $Ga_{X4}Zn_{Y4}O_{Z4}$ (X4, Y4, and Z4 are real numbers greater than to form a mosaic pattern, and $InO_{X1}$ or $In_{X2}Zn_{Y2}O_{Z2}$ forming the mosaic pattern is evenly distributed in the film.

That is, the CAC-OS is a composite metal oxide having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element Min a first region is greater than the atomic ratio of In to an element Min a second region, the first region is described as having higher In concentration than the second region.

Note that IGZO is a common name, which may specify a compound containing In, Ga, Zn, and O. Typical examples of IGZO include a crystalline compound represented by $InGaO_3(ZnO)_{m1}$ (m1 is a natural number) and a crystalline compound represented by $In_{(1+x0)}Ga_{(1−x0)}O_3(ZnO)_{m0}$ (−1≤x0≤1; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. The CAC-OS refers to a composition in which, in the material composition containing In, Ga, Zn, and O, some regions that contain Ga as a main component and are observed as nanoparticles and some regions that contain In as a main component and are observed as nanoparticles are randomly dispersed in a mosaic pattern. Therefore, the crystal structure is a secondary element for the CAC-OS.

Note that in the CAC-OS, a stacked-layer structure including two or more films with different atomic compositions is not included. For example, a two-layer structure of a film containing In as a main component and a film containing Ga as a main component is not included. A boundary between the region containing $GaO_{X3}$ as a main component and the region containing $In_{X2}Zn_{Y2}O_{Z2}$ or $InO_{X1}$ as a main component is not clearly observed in some cases.

In the case where one or more kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, nanoparticle regions containing the selected metal element(s) as a main component(s) are observed in part of a CAC-OS and nanoparticle regions containing In as a main component are observed in part of the CAC-OS, and these nanoparticle regions are randomly dispersed to form a mosaic pattern in the CAC-OS.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The flow rate of the oxygen gas to the total flow rate of the deposition gas in deposition is preferably as low as possible, for example, the flow rate of the oxygen gas is higher than or equal to 0% and lower than 30%, preferably higher than or equal to % and lower than or equal to 10%.

The CAC-OS is characterized in that a clear peak is not observed when measurement is conducted using a θ/2θ scan by an Out-of-plane method, which is an X-ray diffraction (XRD) measurement method. That is, it is found from X-ray diffraction measurement that no alignment in an a-b plane direction and a c-axis direction is observed in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes an nc (nano-crystal) structure with no alignment in the plan-view direction and the cross-sectional direction.

Moreover, for example, it can be checked by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions containing $GaO_{X3}$ or the like as a main component and regions containing $In_{X2}Zn_{Y2}O_{Z2}$ or $InO_{X1}$ as a main component are separated to form a mosaic pattern.

The conductivity of a region containing $In_{X2}Zn_{Y2}O_{Z2}$ or $InO_{X1}$ as a main component is higher than that of a region containing $GaO_{X3}$ or the like as a main component. In other words, when carriers flow through the regions including $In_{X2}Zn_{Y2}O_{Z2}$ or $InO_{X1}$ as a main component, the conductivity of a metal oxide is exhibited. Accordingly, when the regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region containing $GaO_{X3}$ or the like as a main component is higher than that of a region containing $In_{X2}Zn_{Y2}O_{Z2}$ or $InO_{X1}$ as a main component. In other words, when regions including $GaO_{X3}$ or the like as a main component are distributed in a metal oxide, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Lm) and high field-effect mobility (1.1) can be achieved.

A semiconductor element using a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, typically a scan line driver circuit that generates a gate signal, enables a display device with a narrow frame width (also referred to as a narrow bezel) to be provided. Furthermore, with the use of the transistor in a signal line driver circuit that supplies a signal from a signal line of the display device (particularly in a demultiplexer connected to an output terminal of a shift register included in a signal line driver circuit), the display device connected to less number of wirings can be provided.

Furthermore, the transistor including a CAC-OS in the semiconductor layer does not need a laser crystallization step like a transistor including low-temperature polysilicon. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra-high definition ("4K resolution", "4K2K", and "4K") or super high definition ("8K resolution", "8K4K", and "8K"), in which case writing can be performed in a short time and display defects can be reduced.

Alternatively, silicon may be used for a semiconductor in which a channel of a transistor is formed. Amorphous silicon may be used as the silicon; however, the use of silicon with crystallinity is particularly preferable. For example, microcrystalline silicon, polycrystalline silicon, or single-crystal silicon are preferably used. In particular, polycrystalline silicon can be formed at a temperature lower than that for single crystal silicon and has higher field-effect mobility and higher reliability than amorphous silicon.

[Conductive Layer]

Examples of materials that can be used for conductive layers of a variety of wirings and electrodes and the like included in the display device in addition to a gate, a source, and a drain of a transistor include metals such as aluminum, titanium, chromium, nickel, copper, yttrium, zirconium, molybdenum, silver, tantalum, and tungsten and an alloy containing such a metal as its main component. A single-layer structure or stacked-layer structure including a film containing any of these materials can be used. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which an aluminum film or a copper film is stacked over a titanium film or a titanium nitride film and a titanium film or a titanium nitride film is formed thereover, a three-layer structure in which an aluminum film or a copper film is stacked over a molybdenum film or a molybdenum nitride film and a molybdenum film or a molybdenum nitride film is formed thereover, and the like can be given. Note that an oxide such as indium oxide, tin oxide, or zinc oxide may be used. Copper containing manganese is preferably used because it increases controllability of a shape by etching.

[Insulating Layer]

Examples of an insulating material that can be used for the insulating layers include, in addition to a resin such as acrylic resin or epoxy resin and a resin having a siloxane bond such as silicone, an inorganic insulating material such as silicon oxide, silicon oxynitride, silicon nitride oxide, silicon nitride, or aluminum oxide.

Note that in this specification, an oxynitride refers to a material that contains more oxygen than nitrogen in its composition, and a nitride oxide refers to a material that contains more nitrogen than oxygen in its composition. For example, in the case where silicon oxynitride is described, it refers to a material that contains more oxygen than nitrogen in its composition. In the case where silicon nitride oxide is described, it refers to a material that contains more nitrogen than oxygen in its composition.

The light-emitting element is preferably provided between a pair of insulating films with low water permeability. In that case, impurities such as water can be inhibited from entering the light-emitting element, and thus a decrease in device reliability can be inhibited.

Examples of the insulating film with low water permeability include a film containing nitrogen and silicon, such as a silicon nitride film and a silicon nitride oxide film, or a film containing nitrogen and aluminum, such as an aluminum nitride film. Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [g/(m$^2$·day)], still further preferably lower than or equal to $1\times10^{-8}$ [g/(m$^2$·day)].

Structure Example of Display Module

A structure example of a display module including the display device of one embodiment of the present invention will be described below.

Figure 13A:
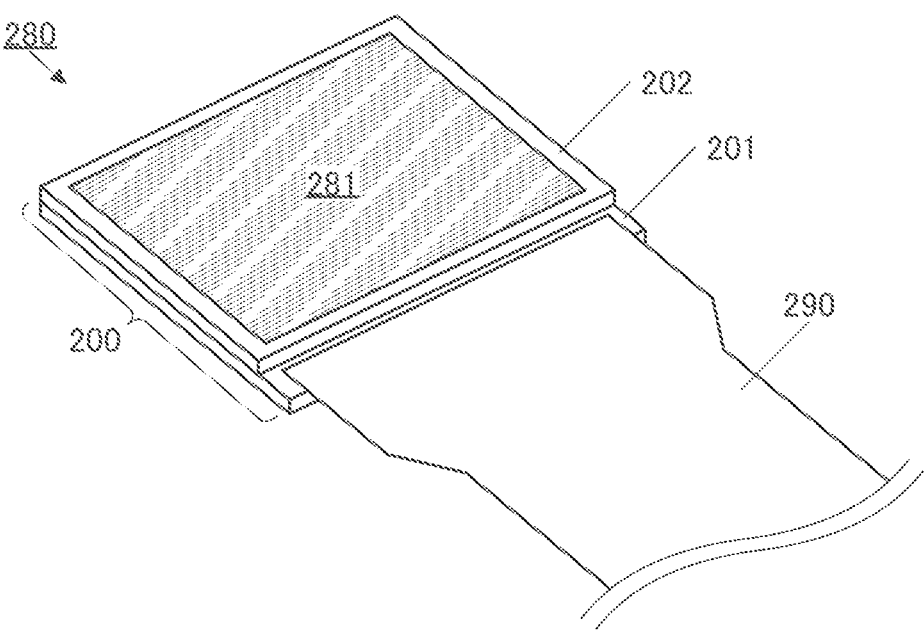
FIG. 13A and FIG. 13B are diagrams illustrating a structure example of a display module.

FIG. 13A is a schematic perspective view of a display module 280. The display module 280 includes a display device 200 and an FPC 290. Any of the display devices (the display device 200A to the display device 200D) described in the above structure example 2 can be used as the display device 200.

The display module 280 includes the substrate 201 and the substrate 202. A display portion 281 is also included on the substrate 202 side. The display portion 281 is a region of the display module 280 where an image is displayed and is a region where light emitted from pixels provided in a pixel portion 284 described later can be seen.

Figure 13B:
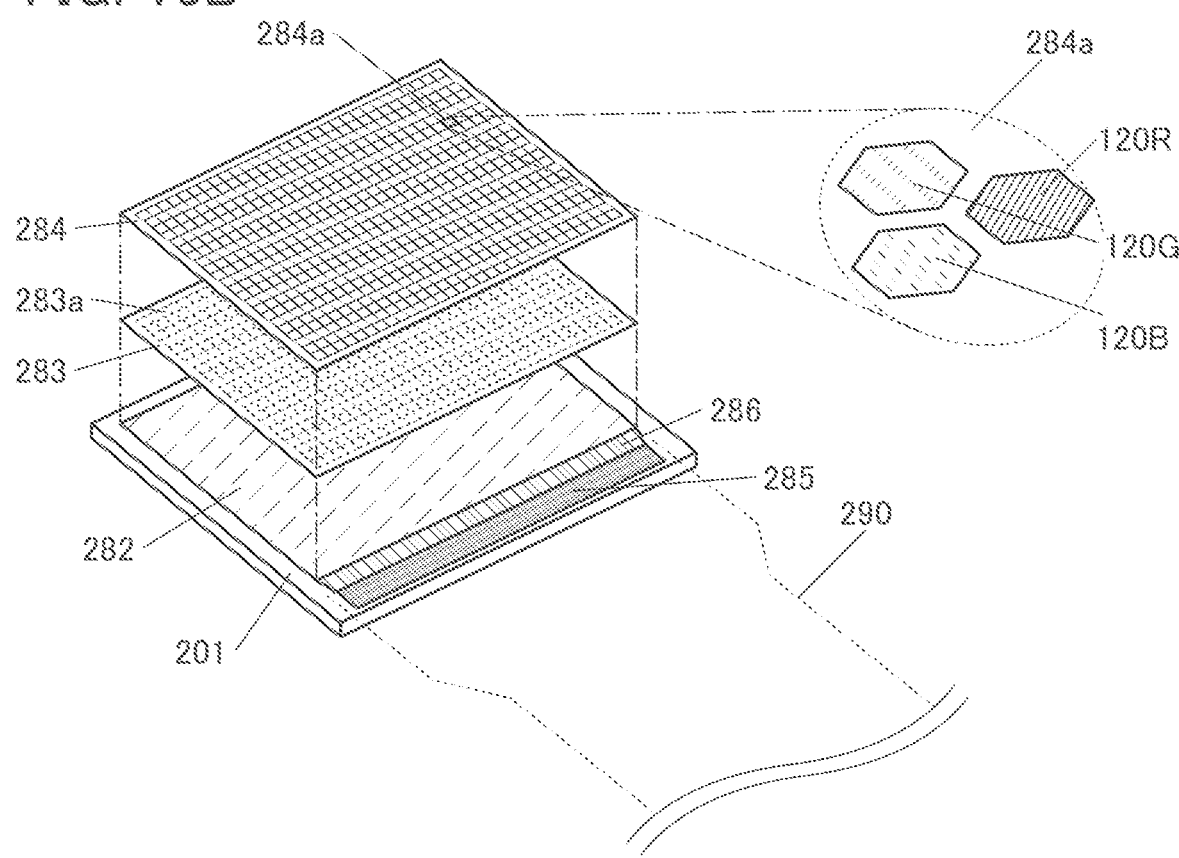

FIG. 13B illustrates a perspective view schematically illustrating a structure on the substrate 201 side. The substrate 201 has a structure in which a circuit portion 282, a pixel circuit portion 283 over the circuit portion 282, and the pixel portion 284 over the pixel circuit portion 283 are stacked. In addition, a terminal portion 285 for connection to the FPC 290 is included in a portion not overlapping with the pixel portion 284 over the substrate 201. The terminal portion 285 and the circuit portion 282 are electrically connected to each other through a wiring portion 286 formed of a plurality of wirings.

The pixel portion 284 includes a plurality of pixels 284a arranged in a matrix. An enlarged view of one pixel 284a is illustrated on the right side of FIG. 13B. The pixel 284a includes the light-emitting element 120R, the light-emitting element 120G, and the light-emitting element 120B.

The pixel circuit portion 283 includes a plurality of pixel circuits 283a that are periodically arranged. The plurality of pixel circuits 283a may be placed in delta arrangement shown in FIG. 13B. With the delta arrangement that enables high-density arrangement of pixel circuits, a high-resolution display device can be provided.

One pixel circuit 283a is a circuit that controls light emission of three light-emitting elements included in one pixel 284a. One pixel circuit 283a may be provided with three circuits each of which controls light emission of one light-emitting element. For example, the pixel circuit 283a can have a structure including at least one selection transistor, one current control transistor (driving transistor), and a capacitor for one light-emitting element. In this case, a gate signal is input to a gate of the selection transistor and a source signal is input to one of a source and a drain thereof. Thus, an active-matrix display device is achieved.

The circuit portion 282 includes a circuit for driving the pixel circuits 283a in the pixel circuit portion 283. For example, a gate line driver circuit and a source line driver circuit are preferably included. In addition, an arithmetic circuit, a memory circuit, a power supply circuit, or the like may be included.

The FPC 290 functions as a wiring for supplying a video signal, a power supply potential, or the like to the circuit portion 282 from the outside. In addition, an IC may be mounted on the FPC 290.

The display module 280 can have a structure in which the pixel circuit portion 283, the circuit portion 282, or the like is stacked below the pixel portion 284; thus, the aperture ratio (the effective display area ratio) of the display portion 281 can be significantly high. For example, the aperture ratio of the display portion 281 can be greater than or equal to 40% and less than 100%, preferably greater than or equal to 50% and less than or equal to 95%, and further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a device for VR such as a head-mounted display or a glasses-type device for AR. For example, even in the case of a structure in which the display portion of the display module 280 is seen through a lens, pixels of the extremely-high-resolution display portion 281 included in the display module 280 are prevented from being seen when the display portion is enlarged by the lens, so that display providing a high sense of immersion can be performed. Without limitation to the above, the display module 280 can also be suitably used for an electronic device having a relatively small display portion. For example, the display module 280 can be suitably used in a display portion of a wearable electronic device such as a watch.

At least part of this embodiment can be implemented in combination with the other embodiments described in this specification as appropriate.

Embodiment 2

In this embodiment, a display device of one embodiment of the present invention will be described with reference to FIG. 14.

Figure 14A:
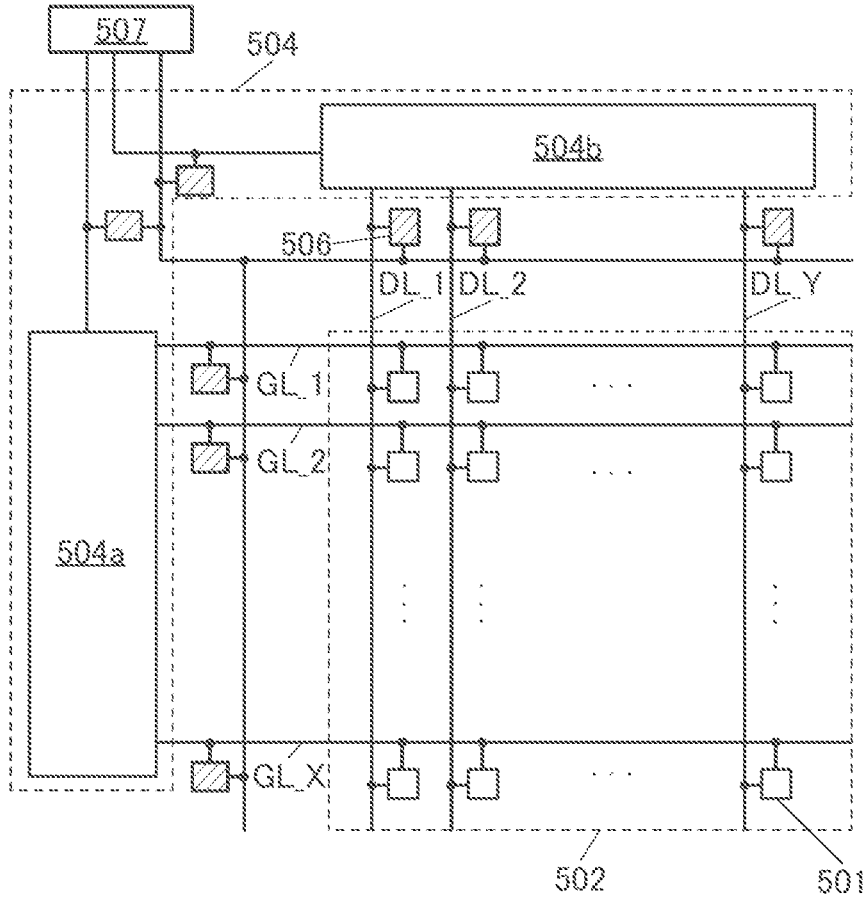
FIG. 14A and FIG. 14B are each a circuit diagram illustrating an example of a display device.

A display device illustrated in FIG. 14A includes a pixel portion 502, a driver circuit portion 504, protection circuits 506, and a terminal portion 507. Note that in the display device of one embodiment of the present invention, the protection circuits 506 may be omitted.

The pixel portion 502 includes a plurality of pixel circuits 501 arranged in X rows and Y columns (X and Y each independently represent a natural number of 2 or more). Each of the pixel circuits 501 includes a circuit for driving a display element.

The driver circuit portion 504 includes driver circuits such as a gate driver 504a that outputs a scan signal to gate lines GL_1 to GL_X and a source driver 504b that supplies a data signal to data lines DL_1 to DL_Y. The gate driver 504a includes at least a shift register. The source driver 504b is formed using a plurality of analog switches, for example. Alternatively, the source driver 504b may be formed using a shift register or the like.

The terminal portion 507 refers to a portion provided with terminals for inputting power, control signals, image signals, and the like to the display device from external circuits.

The protection circuit 506 is a circuit that, when a potential out of a certain range is supplied to a wiring to which the protection circuit 506 is connected, establishes continuity between the wiring and another wiring. The protection circuit 506 illustrated in FIG. 14A is connected to a variety of wirings such as the gate lines GL that are wirings between the gate driver 504a and the pixel circuits 501 and the data lines DL that are wirings between the source driver 504b and the pixel circuits 501, for example. Note that the protection circuits 506 are hatched in FIG. 14A to distinguish the protection circuits 506 from the pixel circuits 501.

The gate driver 504a and the source driver 504b may be provided over a substrate over which the pixel portion 502 is provided, or a substrate where a gate driver circuit or a source driver circuit is separately formed (e.g., a driver circuit board formed using a single crystal semiconductor or a polycrystalline semiconductor) may be mounted on the substrate by COG or TAB (Tape Automated Bonding).

In particular, the gate driver 504a and the source driver 504b are preferably placed below the pixel portion 502.

Figure 14B:
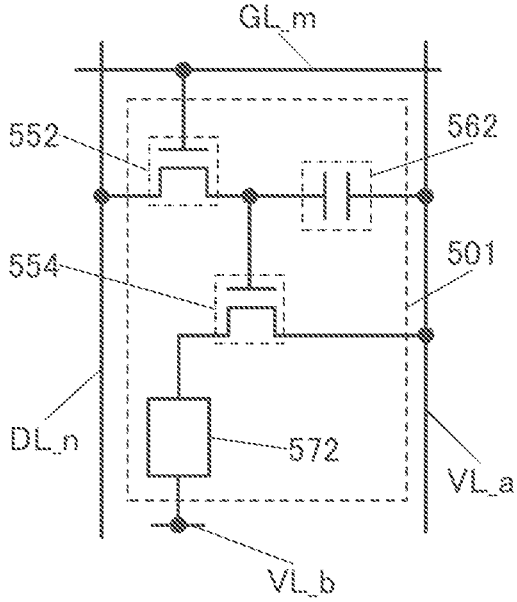

FIG. 14B illustrates a configuration example of a pixel circuit that can be used as the pixel circuit 501.

The pixel circuit 501 illustrated in FIG. 14B includes transistors 552 and 554, a capacitor 562, and a light-emitting element 572. A data line DL n, a gate line GL m, a potential supply line VL_a, a potential supply line VL_b, and the like are connected to the pixel circuit 501. Note that a high power supply potential VDD is supplied to one of the potential supply line VL_a and the potential supply line VL_b, and a low power supply potential VS S is supplied to the other. Current flowing through the light-emitting element 572 is controlled in accordance with a potential supplied to a gate of the transistor 554, whereby the luminance of light emitted from the light-emitting element 572 is controlled.

At least part of this embodiment can be implemented in combination with the other embodiments described in this specification as appropriate.

Embodiment 3

A pixel circuit including a memory for correcting gray levels displayed by pixels that can be used in a display device of one embodiment of the present invention and a display device including the pixel circuit will be described below.

[Circuit Configuration]

Figure 15A:
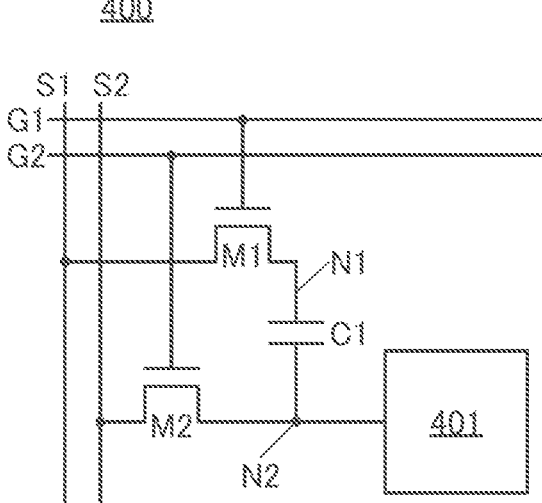
FIG. 15A and FIG. 15C are each a circuit diagram illustrating an example of a display device.

FIG. 15A is a circuit diagram of a pixel circuit 400. The pixel circuit 400 includes a transistor M1, a transistor M2, a capacitor C1, and a circuit 401. A wiring S1, a wiring S2, a wiring G1, and a wiring G2 are connected to the pixel circuit 400.

In the transistor M1, a gate is connected to the wiring G1, one of a source and a drain is connected to the wiring S1, and the other is connected to one electrode of the capacitor C1. In the transistor M2, a gate is connected to the wiring G2, one of a source and a drain is connected to the wiring S2, and the other is connected to the other electrode of the capacitor C1 and the circuit 401.

The circuit 401 is a circuit including at least one display element. Any of a variety of elements can be used as the display element, and typically, a light-emitting element such as an organic EL element or an LED element can be used. In addition, a liquid crystal element, a MEMS (Micro Electro Mechanical Systems) element, or the like can also be used.

A node connecting the transistor M1 and the capacitor C1 is denoted as a node N1, and a node connecting the transistor M2 and the circuit 401 is denoted as a node N2.

In the pixel circuit 400, the potential of the node N1 can be retained when the transistor M1 is turned off. The potential of the node N2 can be retained when the transistor M2 is turned off. When a predetermined potential is written to the node N1 through the transistor M1 with the transistor M2 being in an off state, the potential of the node N2 can be changed in accordance with displacement of the potential of the node N1 owing to capacitive coupling through the capacitor C1.

Here, the transistor using an oxide semiconductor, which is described in Embodiment 1, can be used as one or both of the transistor M1 and the transistor M2. Accordingly, owing to an extremely low off-state current, the potentials of the node N1 and the node N2 can be retained for a long time. Note that in the case where the period in which the potential of each node is retained is short (specifically, the case where the frame frequency is higher than or equal to 30 Hz, for example), a transistor using a semiconductor such as silicon may be used.

Driving Method Example

Figure 15B:
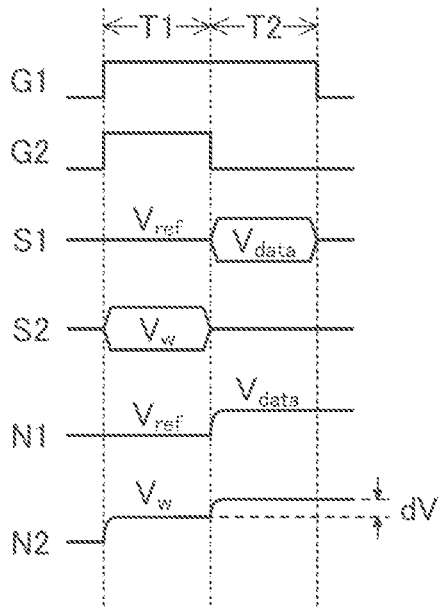
FIG. 15B is a timing chart showing an example of the operation of the display device.

Next, an example of a method for operating the pixel circuit 400 is described with reference to FIG. 15B. FIG. 15B is a timing chart of the operation of the pixel circuit 400. Note that for simplification of description, the influence of various kinds of resistance such as wiring resistance, parasitic capacitance of a transistor, a wiring, or the like, the threshold voltage of the transistor, and the like is not taken into account here.

In the operation shown in FIG. 15B, one frame period is divided into a period T1 and a period T2. The period T1 is a period in which a potential is written to the node N2, and the period T2 is a period in which a potential is written to the node N1.

[Period T1]

In the period T1, a potential for turning on the transistor is supplied to both the wiring G1 and the wiring G2. In addition, a potential $V_{ref}$ that is a fixed potential is supplied to the wiring S1, and a first data potential $V_w$ is supplied to the wiring S2.

The potential $V_{ref}$ is supplied from the wiring S1 to the node N1 through the transistor M1. The first data potential $V_w$ is supplied from the wiring S2 to the node N2 through the transistor M2. Accordingly, a potential difference $V_w$-$V_{ref}$ is retained in the capacitor C1.

[Period T2]

Next, in the period T2, a potential for turning on the transistor M1 is supplied to the wiring G1, and a potential for turning off the transistor M2 is supplied to the wiring G2. A second data potential $V_{data}$ is supplied to the wiring S1. The wiring S2 may be supplied with a predetermined constant potential or brought into a floating state.

The second data potential $V_{data}$ is supplied from the wiring S1 to the node N1 through the transistor M1. At this time, capacitive coupling due to the capacitor C1 changes the potential of the node N2 in accordance with the second data potential $V_{data}$ by a potential dV. That is, a potential that is the sum of the first data potential $V_w$ and the potential dV is input to the circuit 401. Note that although the potential dV is shown as a positive value in FIG. 15B, the potential dV may be a negative value. That is, the second data potential $V_{data}$ may be lower than the potential $V_{ref}$.

Here, the potential dV is roughly determined by the capacitance of the capacitor C1 and the capacitance of the circuit 401. When the capacitance of the capacitor C1 is sufficiently larger than the capacitance of the circuit 401, the potential dV is a potential close to the second data potential $V_{data}$.

In the above manner, the pixel circuit 400 can generate a potential to be supplied to the circuit 401 including the display element, by combining two kinds of data signals; hence, a gray level can be corrected in the pixel circuit 400.

The pixel circuit 400 can also generate a potential exceeding the maximum potential that can be supplied to the wiring S1 and the wiring S2. For example, in the case of using a light-emitting element, high-dynamic range (HDR) display or the like can be performed. In the case of using a liquid crystal element, overdriving or the like can be achieved.

Application Example

Figure 15C:
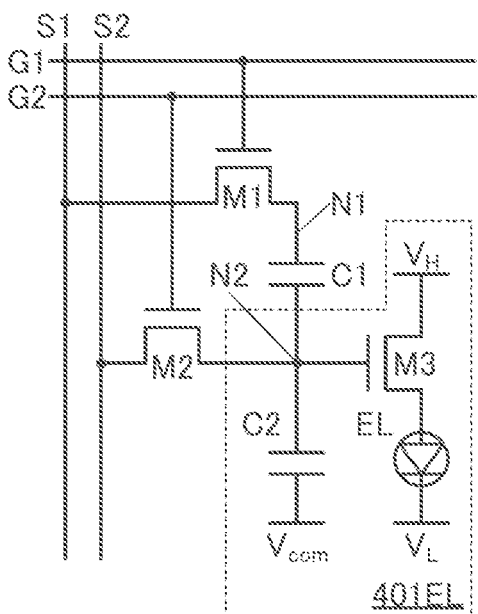

A pixel circuit 400EL illustrated in FIG. 15C includes a circuit 401EL. The circuit 401EL includes a light-emitting element EL, a transistor M3, and the capacitor C2.

In the transistor M3, a gate is connected to the node N2 and one electrode of the capacitor C2, one of a source and a drain is connected to a wiring supplying a potential VH, and the other is connected to one electrode of the light-emitting element EL. The other electrode of the capacitor C2 is connected to a wiring supplying a potential $V_{com}$. The other electrode of the light-emitting element EL is connected to a wiring supplying a potential VL.

The transistor M3 has a function of controlling a current to be supplied to the light-emitting element EL. The capacitor C2 functions as a storage capacitor. The capacitor C2 can be omitted when not needed.

Note that although the structure in which the anode side of the light-emitting element EL is connected to the transistor M3 is described here, the transistor M3 may be connected to the cathode side. In that case, the values of the potential VH and the potential VL can be appropriately changed.

In the pixel circuit 400EL, a large amount of current can flow through the light-emitting element EL when a high potential is applied to the gate of the transistor M3, which enables HDR display, for example. Moreover, a variation in the electrical characteristics of the transistor M3 or the light-emitting element EL can be corrected by supply of a correction signal to the wiring S1 or the wiring S2.

Note that the configuration is not limited to the circuits shown in FIG. 15C, and a configuration to which a transistor, a capacitor, or the like is further added may be employed.

At least part of this embodiment can be implemented in combination with the other embodiments described in this specification as appropriate.

Embodiment 4

In this embodiment, structure examples of an electronic device for which the display device of one embodiment of the present invention is used will be described.

The display device and the display module of one embodiment of the present invention can be applied to a display portion of an electronic device or the like having a display function. Examples of such an electronic device include a digital camera, a digital video camera, a digital photo frame, a mobile phone, a portable game machine, a portable information terminal, and an audio reproducing device, in addition to electronic devices with a relatively large screen, such as a television device, a laptop personal computer, a monitor device, digital signage, a pachinko machine, and a game machine.

In particular, the display device and the display module of one embodiment of the present invention can have a high resolution, and thus can be favorably used for an electronic device having a relatively small display portion. Examples of such an electronic device include: a watch-type or bracelet-type information terminal device (wearable device); and a wearable device worn on a head, such as a device for VR such as a head mounted display and a glasses-type device for AR.

Figure 16A:
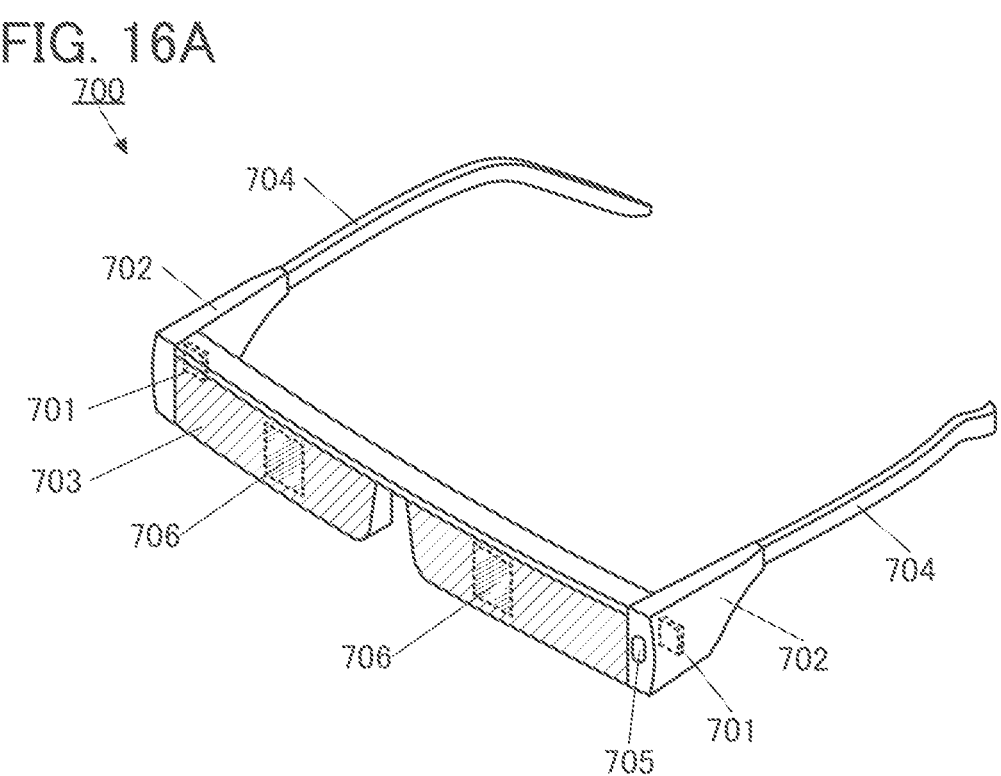
FIG. 16A and FIG. 16B are diagrams illustrating a structure example of an electronic device.

FIG. 16A is a perspective view of an electronic device 700 that is of a glasses type. The electronic device 700 includes a pair of display panels 701, a pair of housings 702, a pair of optical members 703, a pair of temples 704, and the like.

The electronic device 700 can project an image displayed on the display panel 701 onto a display region 706 of the optical member 703. Since the optical members 703 have a light-transmitting property, a user can see images displayed on the display regions 706, which are superimposed on transmission images seen through the optical members 703. Thus, the electronic device 700 is an electronic device capable of AR display.

One of the housings 702 includes a camera 705 capable of taking an image of what lies in front thereof. Although not illustrated, one of the housings 702 is provided with a wireless receiver or a connector to which a cable can be connected, whereby a video signal or the like can be supplied to the housing 702. Furthermore, when the housing 702 is provided with an acceleration sensor such as a gyroscope sensor, the orientation of the user's head can be detected and an image corresponding to the orientation can be displayed on the display region 706. Moreover, the housing 702 is preferably provided with a battery, in which case charging can be performed with or without a wire.

Figure 16B:
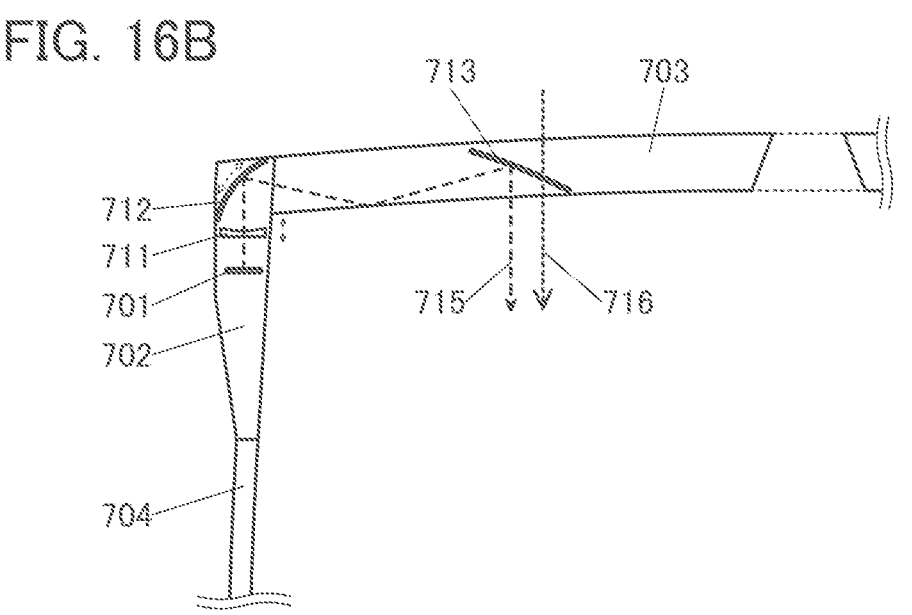

Next, a method for projecting an image on the display region 706 of the electronic device 700 is described with reference to FIG. 16B. The display panel 701, a lens 711, and a reflective plate 712 are provided in the housing 702. A reflective surface 713 functioning as a half mirror is provided in a portion corresponding to the display region 706 of the optical member 703.

Light 715 emitted from the display panel 701 passes through the lens 711 and is reflected by the reflective plate 712 to the optical member 703 side. In the optical member 703, the light 715 is fully reflected repeatedly by end surfaces of the optical member 703 and reaches the reflective surface 713, whereby an image is projected on the reflective surface 713. Accordingly, the user can see both the light 715 reflected by the reflective surface 713 and transmitted light 716 transmitted through the optical member 703 (including the reflective surface 713).

FIG. 16 shows an example in which the reflective plate 712 and the reflective surface 713 each have a curved surface. This can increase optical design flexibility and reduce the thickness of the optical member 703, compared to the case where they have flat surfaces. Note that the reflective plate 712 and the reflective surface 713 may be flat.

The reflective plate 712 can use a component having a mirror surface, and preferably has high reflectance. As the reflective surface 713, a half mirror utilizing reflection of a metal film may be used, but the use of prism utilizing total reflection or the like can increase the transmittance of the transmitted light 716.

Here, the housing 702 preferably includes a mechanism for adjusting the distance or angle between the lens 711 and the display panel 701. This enables operations such as focus adjustment and zooming in/out of image. One or both of the lens 711 and the display panel 701 are preferably configured to be movable in the optical-axis direction, for example.

The housing 702 preferably includes a mechanism capable of adjusting the angle of the reflective plate 712. The position of the display region 706 where images are displayed can be changed by changing the angle of the reflective plate 712. Thus, the display region 706 can be placed at the most appropriate position in accordance with the position of the user's eye.

The display device or the display module of one embodiment of the present invention can be used for the display panel 701. Thus, the electronic device 700 can perform display with extremely high resolution.

Figure 17A:
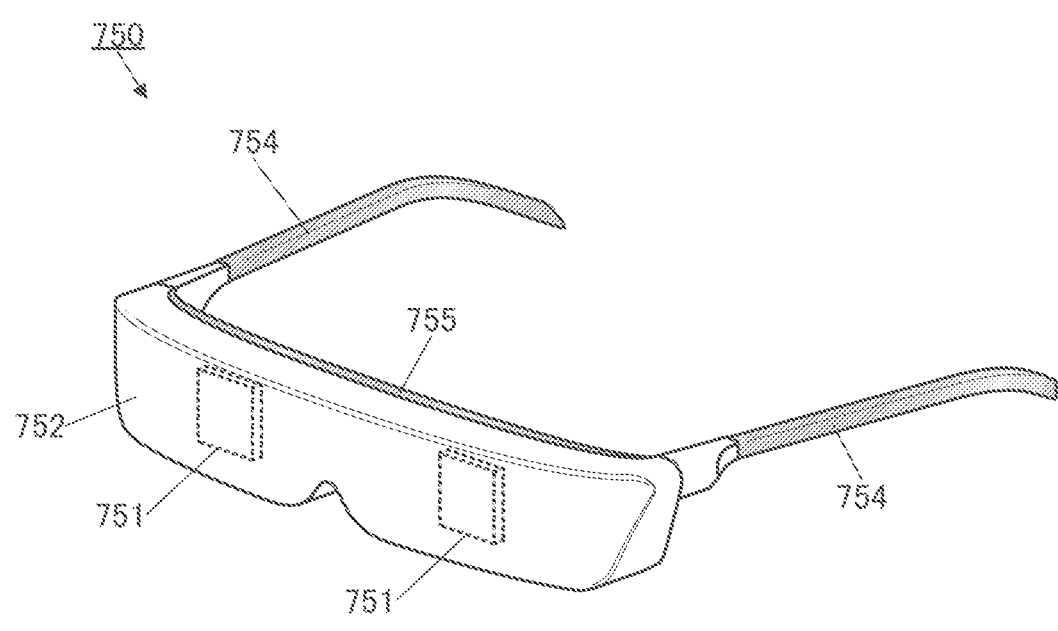
FIG. 17A and FIG. 17B are diagrams illustrating a structure example of an electronic device.
Figure 17B:
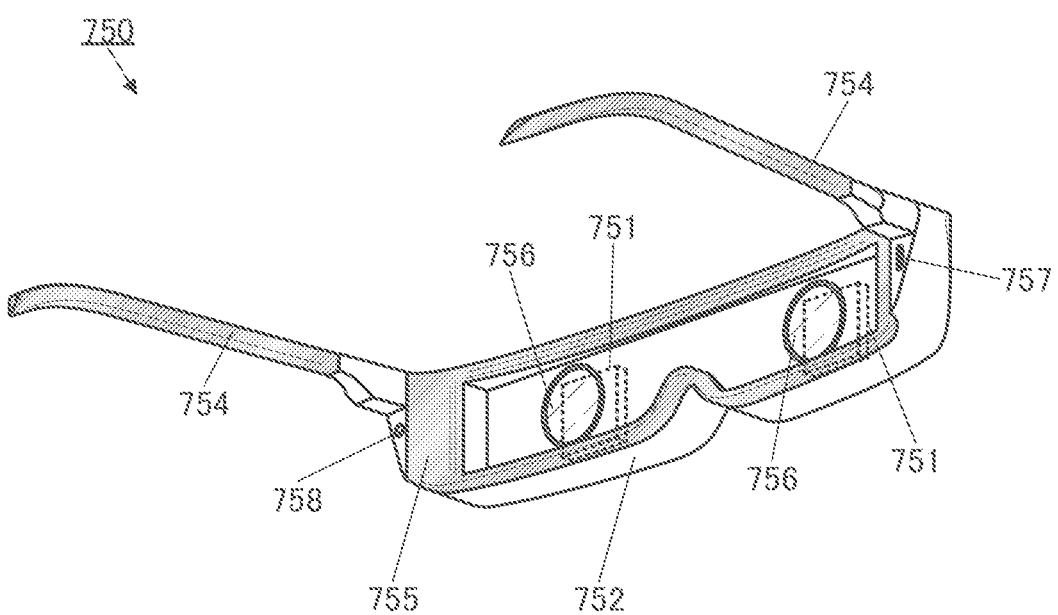

FIG. 17A and FIG. 17B illustrate perspective views of an electronic device 750 that is of a goggle-type. FIG. 17A is a perspective view illustrating the front surface, the top surface, and the left side surface of the electronic device 750, and FIG. 17B is a perspective view illustrating the back surface, the bottom surface, and the right side surface of the electronic device 750.

The electronic device 750 includes a pair of display panels 751, a housing 752, a pair of temples 754, a cushion 755, a pair of lenses 756, and the like. The pair of display panels 751 is positioned to be seen through the lenses 756 inside the housing 752.

The electronic device 750 is an electronic device for VR. A user wearing the electronic device 750 can see an image displayed on the display panel 751 through the lens 756. Furthermore, when the pair of display panels 751 displays different images, three-dimensional display using parallax can be performed.

An input terminal 757 and an output terminal 758 are provided on the back side of the housing 752. To the input terminal 757, a cable for supplying a video signal from a video output device or the like, power for charging a battery provided in the housing 752, or the like can be connected. The output terminal 758 can function as, for example, an audio output terminal to which earphones, headphones, or the like can be connected. Note that in the case where audio data can be output by wireless communication or sound is output from an external video output device, the audio output terminal is not necessarily provided.

In addition, the housing 752 preferably includes a mechanism by which the left and right positions of the lens 756 and the display panel 751 can be adjusted to the optimal positions in accordance with the position of the user's eye. In addition, the housing 752 preferably includes a mechanism for adjusting focus by changing the distance between the lens 756 and the display panel 751.

The display device or the display module of one embodiment of the present invention can be used for the display panel 751. Thus, the electronic device 750 can perform display with extremely high resolution. This enables a user to feel high sense of immersion.

The cushion 755 is a portion in contact with the user's face (forehead, cheek, or the like). The cushion 755 is in close contact with the user's face, so that light leakage can be prevented, which increases the sense of immersion. A soft material is preferably used as the cushion 755 so that the cushion 755 is in close contact with the face of the user wearing the electronic device 750. For example, a material such as rubber, silicone rubber, urethane, or sponge can be used. Furthermore, when a sponge or the like whose surface is covered with cloth, leather (natural leather or synthetic leather), or the like is used, a gap is unlikely to be generated between the user's face and the cushion 755, whereby light leakage can be suitably prevented. Furthermore, using such a material is preferable because it has a soft texture and the user does not feel cold when wearing the device in a cold season, for example. The member in contact with user's skin, such as the cushion 755 or the temple 754, is preferably detachable because cleaning or replacement can be easily performed.

At least part of this embodiment can be implemented in combination with the other embodiments described in this specification as appropriate.

REFERENCE NUMERALS

100A-G, 200, 200A-D: display device, 101, 201, 202: substrate, 111, 114, 114B, 114G, 114R, 116, 141, 142, 143, 211, 224, 225, 227, 241, 242, 251, 252, 253, 271a, 271b: conductive layer, 111f, 112f, 130f, 141f, 142f, 143f: conductive film, 112: reflective layer, 113, 117, 118, 121: insulating layer, 113f: insulating film, 115: EL layer, 120, 120R, 120B, 120G: light-emitting element, 130, 131, 271-274: plug, 151, 152, 153, 154, 155, 156: resist mask, 161-163, 213, 214, 223, 226, 228, 229, 231, 232, 243, 261, 261a, 261b, 262-265: insulating layer, 164: adhesive layer, 165B, 165G, 165R: coloring layer, 210, 220, 230: transistor, 212: low-resistance region, 215: element isolation layer, 221: semiconductor layer, 240: capacitor, 280: display module, 281: display portion, 282: circuit portion, 283: pixel circuit portion, 283a: pixel circuit, 284: pixel portion, 84a: pixel, 285: terminal portion, 286: wiring portion, 290: FPC

The invention claimed is:

1. A display device comprising a first light-emitting element and a second light-emitting element,

wherein the first light-emitting element comprises a first lower electrode, a first reflective layer, a first insulating layer, a first conductive layer, a light-emitting layer, and an upper electrode, wherein the first lower electrode, the first reflective layer, the first insulating layer, the first conductive layer, the light-emitting layer, and the upper electrode are stacked in this order, wherein the second light-emitting element comprises a second lower electrode, a second reflective layer, a second insulating layer, a second conductive layer, the light-emitting layer, and the upper electrode, wherein the second lower electrode, the second reflective layer, the second insulating layer, the second conductive layer, the light-emitting layer, and the upper electrode are stacked in this order, wherein the first conductive layer, the first insulating layer, the second conductive layer, and the second insulating layer each have a light-transmitting property, wherein the second conductive layer is thicker than the first conductive layer, wherein the upper electrode has a transmitting property and a reflective property with respect to visible light, wherein the first lower electrode is electrically connected to the first conductive layer, and wherein the second lower electrode is electrically connected to the second conductive layer.

2. The display device according to claim 1, wherein the first lower electrode is covered with the first conductive layer, and wherein the second lower electrode is covered with the second conductive layer.

3. A display device comprising a first light-emitting element, a second light-emitting element, a first plug, and a second plug, wherein the first light-emitting element comprises a first lower electrode, a first reflective layer, a first insulating layer, a first conductive layer, a light-emitting layer, and an upper electrode, wherein the first lower electrode, the first reflective layer, the first insulating layer, the first conductive layer, the light-emitting layer, and the upper electrode are stacked in this order, wherein the second light-emitting element comprises a second lower electrode, a second reflective layer, a second insulating layer, a second conductive layer, the light-emitting layer, and the upper electrode, wherein the second lower electrode, the second reflective layer, the second insulating layer, the second conductive layer, the light-emitting layer, and the upper electrode are stacked in this order, wherein the first conductive layer, the first insulating layer, the second conductive layer, and the second insulating layer each have a light-transmitting property, wherein the second conductive layer is thicker than the first conductive layer, wherein the upper electrode has a transmitting property and a reflective property with respect to visible light, wherein the first lower electrode is electrically connected to the first conductive layer through the first plug, wherein the second lower electrode is electrically connected to the second conductive layer through the second plug, wherein the first plug is embedded in the first insulating layer, and wherein the second plug is embedded in the second insulating layer.

4. The display device according to claim 1, wherein the first conductive layer comprises a first film, wherein the second conductive layer comprises a second film and a third film, wherein the second film and the third film are stacked in this order, and wherein the first film and the third film have the same composition.

5. The display device according to claim 1, further comprising a circuit layer comprising a transistor, wherein the first light-emitting element is provided over the circuit layer and is electrically connected to the transistor.

6. The display device according to claim 5, wherein the transistor comprises a metal oxide with crystallinity or single crystal silicon in a semiconductor layer where a channel is formed.

7. The display device according to claim 1, further comprising:

a first circuit layer comprising a first transistor;

a second circuit layer comprising a second transistor;

a third insulating layer over the first circuit layer; and a fourth insulating layer between the first circuit layer and the second circuit layer, wherein the first light-emitting element is electrically connected to the first transistor.

8. The display device according to claim 7, wherein the first transistor comprises a metal oxide with crystallinity in a first semiconductor layer where a channel is formed, and wherein the second transistor comprises a metal oxide with crystallinity or single crystal silicon in a second semiconductor layer where a channel is formed.

9. The display device according to claim 1, further comprising a plurality of the first light-emitting elements, wherein the first light-emitting elements are periodically arranged at a resolution of 2000 ppi or higher.

10. The display device according to claim 9, wherein the first light-emitting elements are placed in delta arrangement.

11. The display device according to claim 3, wherein the first conductive layer comprises a first film, wherein the second conductive layer comprises a second film and a third film, wherein the second film and the third film are stacked in this order, and wherein the first film and the third film have the same composition.

12. The display device according to claim 3, further comprising a circuit layer comprising a transistor, wherein the first light-emitting element is provided over the circuit layer and is electrically connected to the transistor.

13. The display device according to claim 12, wherein the transistor comprises a metal oxide with crystallinity or single crystal silicon in a semiconductor layer where a channel is formed.

14. The display device according to claim 3, further comprising:

a first circuit layer comprising a first transistor;

a second circuit layer comprising a second transistor;

a third insulating layer over the first circuit layer; and a fourth insulating layer between the first circuit layer and the second circuit layer, wherein the first light-emitting element is electrically connected to the first transistor.

15. The display device according to claim 14, wherein the first transistor comprises a metal oxide with crystallinity in a first semiconductor layer where a channel is formed, and wherein the second transistor comprises a metal oxide with crystallinity or single crystal silicon in a second semiconductor layer where a channel is formed.

16. The display device according to claim 3, further comprising a plurality of the first light-emitting elements, wherein the first light-emitting elements are periodically arranged at a resolution of 2000 ppi or higher.

17. The display device according to claim 16, wherein the first light-emitting elements are placed in delta arrangement.

* * * * *